(12) United States Patent
Chiang et al.

(10) Patent No.: US 11,133,224 B2
(45) Date of Patent: Sep. 28, 2021

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Hsin-Che Chiang, Taipei (TW); Yu-San Chien, Hsinchu (TW); Ta-Chun Lin, Hsinchu (TW); Chun-Sheng Liang, Puyan Township (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 16/585,677

(22) Filed: Sep. 27, 2019

(65) Prior Publication Data

US 2021/0098312 A1 Apr. 1, 2021

(51) Int. Cl.
| | |
|---|---|
| *H01L 21/8238* | (2006.01) |
| *H01L 27/092* | (2006.01) |
| *H01L 29/66* | (2006.01) |
| *H01L 21/02* | (2006.01) |
| *H01L 29/78* | (2006.01) |

(52) U.S. Cl.
CPC ............... *H01L 21/823821* (2013.01); *H01L 21/02532* (2013.01); *H01L 21/02554* (2013.01); *H01L 21/823807* (2013.01); *H01L 21/823814* (2013.01); *H01L 27/0924* (2013.01); *H01L 29/66545* (2013.01); *H01L 29/66795* (2013.01); *H01L 29/785* (2013.01)

(58) Field of Classification Search
CPC ......... H01L 21/823821; H01L 27/0924; H01L 29/66795; H01L 29/66545; H01L 21/02554

See application file for complete search history.

(56) References Cited

U.S. PATENT DOCUMENTS

| | | | | |
|---|---|---|---|---|
| 8,828,818 | B1* | 9/2014 | Rodder | H01L 21/845 |
| | | | | 438/218 |
| 9,543,419 | B1* | 1/2017 | Fan | H01L 29/66818 |
| 2015/0194426 | A1* | 7/2015 | Liu | H01L 21/823431 |
| | | | | 257/401 |
| 2015/0202198 | A1* | 7/2015 | Zhang | A61P 25/16 |
| | | | | 514/288 |
| 2016/0181360 | A1* | 6/2016 | Wang | H01L 21/0223 |
| | | | | 257/401 |

(Continued)

*Primary Examiner* — Khaja Ahmad
*Assistant Examiner* — Khatib A Rahman
(74) *Attorney, Agent, or Firm* — McClure, Qualey & Rodack, LLP

(57) ABSTRACT

A method for forming a semiconductor structure is provided. The method for forming the semiconductor structure includes forming a first fin structure with a first composition and a second fin structure with a second composition, oxidizing the first fin structure to form a first oxide layer and oxidizing the second fin structure to form a second oxide layer, removing the second oxide layer formed on the second fin structure, oxidizing the second fin structure to form a third oxide layer over the second fin structure, and forming a first metal gate electrode layer over the first oxide layer and a second metal gate electrode layer over the third oxide layer.

20 Claims, 35 Drawing Sheets

(56) References Cited

U.S. PATENT DOCUMENTS

| | | | |
|---|---|---|---|
| 2016/0197004 A1* | 7/2016 | Akarvardar | H01L 29/7842 |
| | | | 257/509 |
| 2016/0233321 A1* | 8/2016 | Ching | H01L 21/28229 |
| 2016/0343845 A1* | 11/2016 | Chen | H01L 29/167 |
| 2017/0005090 A1* | 1/2017 | Ando | H01L 27/0886 |
| 2017/0053912 A1* | 2/2017 | Ching | H01L 21/764 |
| 2017/0133486 A1* | 5/2017 | Zhou | H01L 21/823842 |
| 2017/0162383 A1* | 6/2017 | Li | H01L 21/324 |
| 2017/0200810 A1* | 7/2017 | Mao | H01L 29/785 |
| 2017/0229560 A1* | 8/2017 | Yu | H01L 29/7856 |
| 2017/0330884 A1* | 11/2017 | Ching | H01L 21/02532 |
| 2018/0130802 A1* | 5/2018 | Wang | H01L 27/0928 |
| 2018/0226403 A1* | 8/2018 | Chen | H01L 27/0886 |

* cited by examiner

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-2E, 2F-1, 2F-2, 2F-3, 2G-2M, 2N-1 and 2N-2 are cross-sectional views illustrating the formation of a semiconductor device at various intermediate stages, in accordance with some embodiments of the disclosure.

FIGS. 4A-4F, 4G-1, 4G-2, 4G-3, 4H, 4I-1 and 4I-2 are cross-sectional views illustrating the formation of a semiconductor device at various intermediate stages, in accordance with some embodiments of the disclosure.

DETAILED DESCRIPTION

Figure 1:
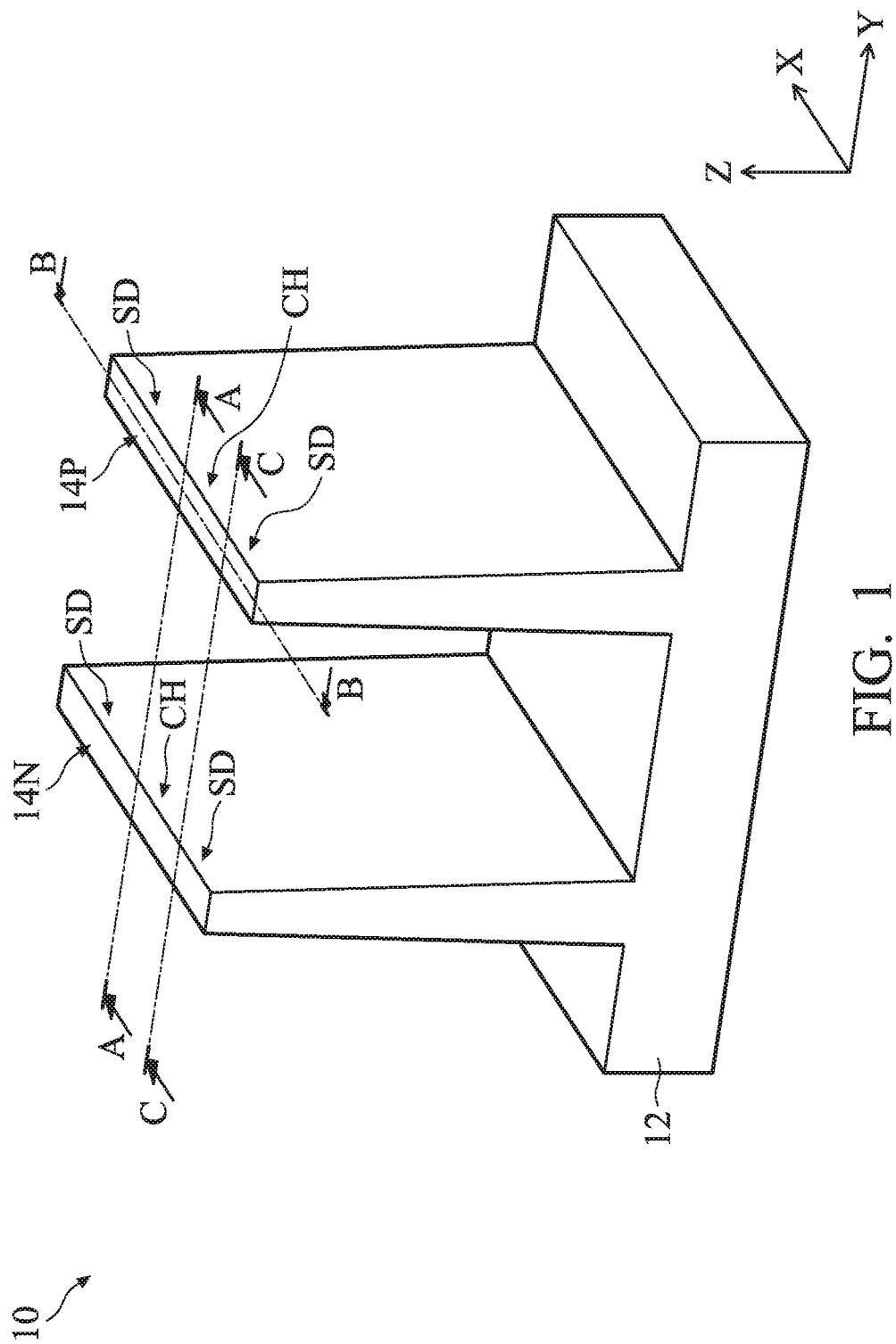
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of forming a semiconductor structure are provided. The method for forming the semiconductor structure may include selectively trimming a P-fin structure. The trimming process includes oxidizing an N-fin structure to form a silicon oxide layer and a P fin structure to form a germanium oxide layer, and selectively removing the germanium oxide layer formed on the P-fin structure in an etching process. As a result, the P-fin structure is selectively trimmed while the N-first fin remains untrimmed, which may allow for independent adjustment of the performance of the different type of semiconductor devices. Furthermore, the fin structure may be fabricated initially with a larger dimension (e.g., fin width) or a lower aspect ratio, and thus fin bending and collapse may be less of a concern.

FIG. 1 is a perspective view of a semiconductor structure, in accordance with some embodiments of the disclosure. For a better understanding of the semiconductor structure, an X-Y-Z coordinate reference is provided in FIG. 1. The X-axis and Y-axis are generally orientated along the lateral directions that are parallel to the main surface of the semiconductor structure. The Y-axis is transverse (e.g., perpendicular or substantially perpendicular) to the X-axis. The Z-axis is generally oriented along the vertical direction that is perpendicular to the main surface of a semiconductor structure (or the X-Y plane).

A semiconductor structure 10 is provided, as shown in FIG. 1, in accordance with some embodiments. The semiconductor structure 10 includes a bulk substrate 12, and an N-fin structure 14N and a P-fin structure 14P disposed on the bulk substrate 12 in accordance with some embodiments.

The N-fin structure 14N is used to form one or more N-type semiconductor devices thereon, such as N-channel fin field-effect transistors (N-FINFET) devices, in accordance with some embodiments. The P-fin structure 14P is used to form one or more P-type semiconductor devices thereon, such as P-FINFET devices, in accordance with some embodiments.

The N-fin structure 14N and the P-fin structure 14P extend in the X direction, in accordance with some embodiments. That is, the N-fin structure 14N and the P-fin structure 14P each have longitudinal axes parallel to the X direction, in accordance with some embodiments. Furthermore, the N-fin structure 14N and the P-fin structure 14P are arranged in the Y direction, in accordance with some embodiments.

The N-fin structure 14N and the P-fin structure 14P each includes a channel region CH and source/drain regions SD, where the channel region CH is defined between the source/drain regions SD, in accordance with some embodiments. It should be noted that the fin structures 14N and 14P may include any number of the channel regions CH and the source/drain regions SD. Gate structures (not shown) will be formed across the channel regions CH of the N-fin structure 14N and the P-fin structure 14P and interpose the source/drain regions SD, thereby wrapping portions of the N-fin structure 14N and the P-fin structure 14P, in accordance with some embodiments.

FIG. 1 further illustrates a reference cross-section that is used in later figures. Cross-section A-A is in a plane across the channel region CH of the N-fin structure 14N and the channel region CH of the P-fin structure 14P and is along the longitudinal axis of a gate structure, in accordance with some embodiments. Cross-section B-B is perpendicular to cross-section A-A and is along the longitudinal axis of the P-fin structure 14P, in accordance with some embodiments. Cross-section C-C is in a plane across the source/drain region SD of the N-fin structure 14N and the source/drain region SD of the P-fin structure 14P, in accordance with some embodiments.

FIGS. 2A-2E, 2F-1, 2F-2, 2F-3, 2G-2M, 2N-1 and 2N-2 are cross-sectional views illustrating the formation of a semiconductor device at various intermediate stages, in accordance with some embodiments of the disclosure. FIGS. 2A-2E, 2F-1, 2G-2M, and 2N-1 are illustrated corresponding to the cross-section A-A of FIG. 1; FIGS. 2F-2 and 2N-2 are illustrated corresponding to the cross-section B-B of FIG. 1; and FIG. 2F-3 is illustrated corresponding to the cross-section C-C of FIG. 1.

Figure 2A:
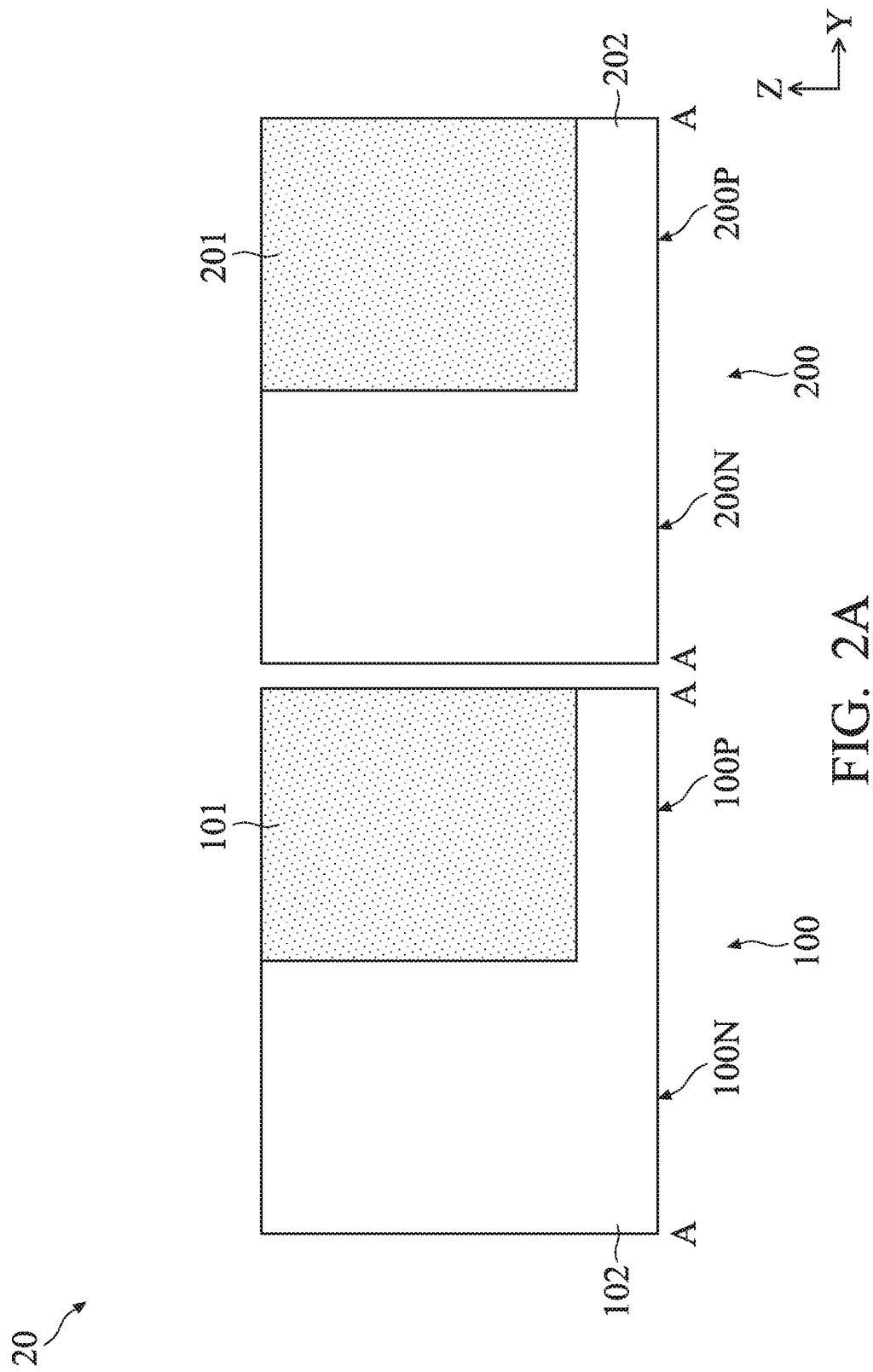

FIG. 2A is a cross-sectional view illustrating a semiconductor structure, in accordance with some embodiments.

A semiconductor structure 20 is provided, as shown in FIG. 2A, in accordance with some embodiments. The semiconductor structure 20 includes a bulk substrate, in accordance with some embodiments. In some embodiments, the bulk substrate is a semiconductor substrate such as a silicon substrate. In some embodiments, the bulk substrate includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the bulk substrate may optionally include an epitaxial layer (epi-layer), may be strained for performance enhancement, may include a silicon-on-insulator (SOI) structure, and/or have other suitable enhancement features. In some embodiments, the bulk substrate (or the surface portion of the bulk substrate) is made of substantially pure silicon or silicon germanium ($SiGe_x$), where x is less than 20%.

The semiconductor structure 20 (or the bulk substrate) may include various device regions, e.g., a logic region, a memory region, an analog region, a peripheral region (e.g., input/output region), another suitable region, or a combination thereof. The semiconductor structure 20 (or the bulk substrate) includes a core region 100 and an input/output region 200, as shown in FIG. 2A, in accordance with some embodiments. Core devices may be formed in the core region 100 to perform the designed functions of an integrated circuit (IC) device, and input/output devices may be formed in the input/output region 200 to communicate with external circuits. Although the core region 100 and the input/output region 200 are shown as being separate in the figure, the core region 100 and the input/output region 200 are part of an integrated circuit (IC) device, in accordance with some embodiments.

A portion of the bulk substrate in the core region 100 is referred to as a substrate 102 and a portion of the bulk substrate in the input/output region 200 is referred to as a substrate 202, in accordance with some embodiments. The core region 100 (or the substrate 102) includes an NMOS region 100N in which N-type semiconductor devices will be formed and a PMOS region 100P in which P-type semiconductor devices will be formed, in accordance with some embodiments. The input/output region 200 (or the substrate 202) includes an NMOS region 200N in which N-type semiconductor devices will be formed and a PMOS region 200P in which P-type semiconductor devices will be formed, in accordance with some embodiments.

Afterward, portions of the bulk substrate at the PMOS regions 100P and 200P is replaced with a semiconductor material, as shown in FIG. 2A, in accordance with some embodiments. An upper portion of the substrate 102 at the PMOS region 100P is replaced with a semiconductor material 101, and an upper portion of the substrate 202 at the PMOS region 200P is replaced with a semiconductor material 201, in accordance with some embodiments.

The semiconductor materials 101 and 201 are silicon germanium ($SiGe_y$), where y is greater than about 20%, e.g., ranging from about 20% to about 45%, in accordance with some embodiments. In some embodiments, the bulk substrate (including the substrates 102 and 202) is made of silicon, and the semiconductor materials 101 and 201 are silicon germanium. In some embodiments, the bulk substrate (or the upper portion of the bulk substrate) is made of $SiGe_x$, and the semiconductor materials 101 and 201 are $SiGe_y$ with higher Ge concentration than the bulk substrate (or the upper portion of the bulk substrate) (i.e., y>x).

In some embodiments, the replacement process includes recessing the substrate 102 and 202 using photolithography and etching processes to form spaces at the PMOS regions 100P and 200P, and depositing the semiconductor materials 101 and 201 in the spaces using a deposition process such as an epitaxial growth technique, a chemical vapor deposition (CVD), another suitable technique, and/or a combination thereof. After the replacement process, a planarization process may be performed on the semiconductor structure 20 such that the upper surface of the substrates 102 and 202 are exposed.

Figure 2B:
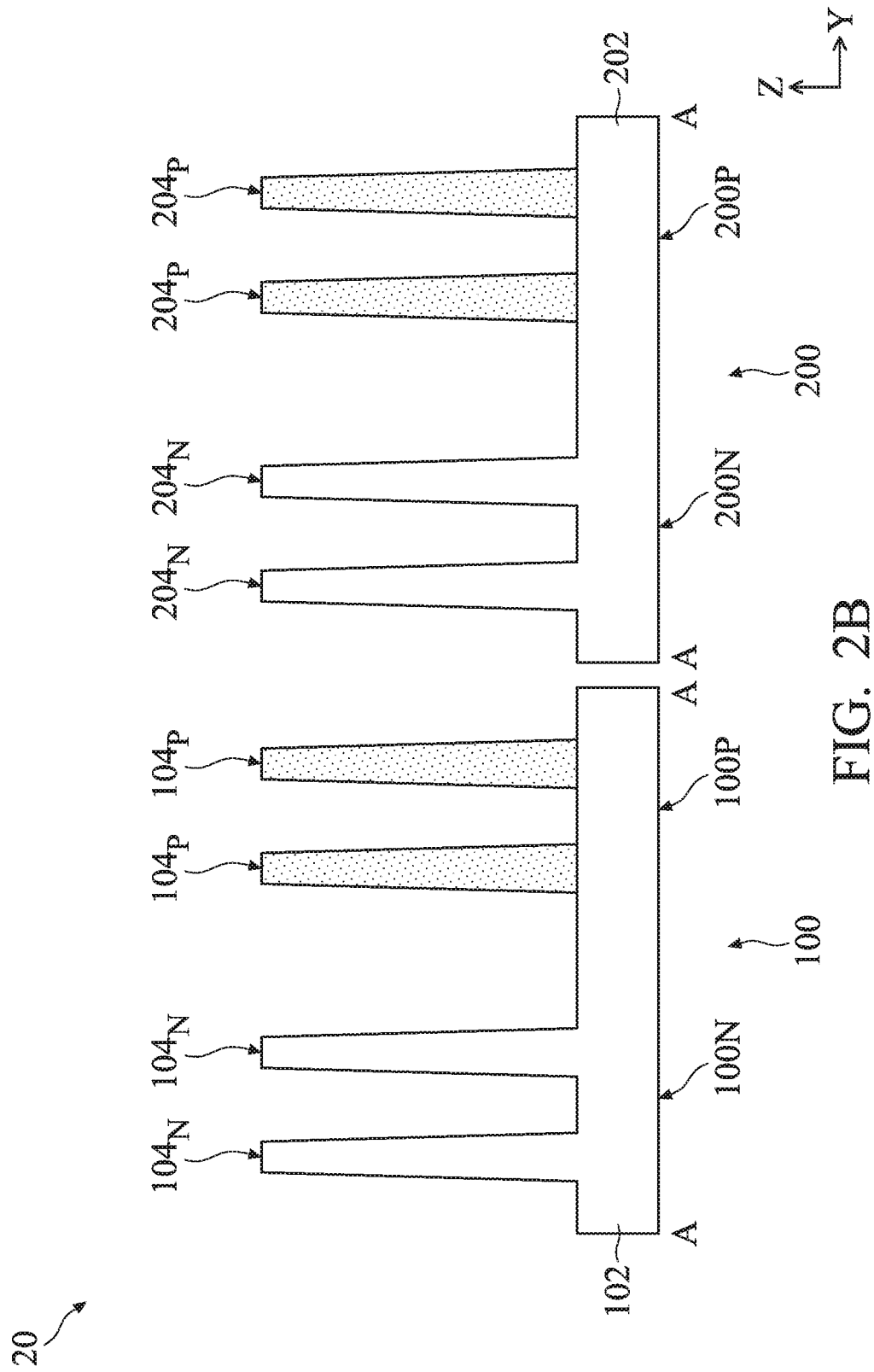

FIG. 2B is a cross-sectional view illustrating a semiconductor structure after the formation of fin structures, in accordance with some embodiments.

Fin structures $104_N$, $104_P$, $204_N$ and $204_P$ are formed on the semiconductor structure 20, as shown in FIG. 2B, in accordance with some embodiments. In the core region 100, the fin structures $104_N$ are formed on the substrate 102 at the NMOS region 100N, and thus the fin structures $104_N$ are referred to as N-fin structures $104_N$, in accordance with some embodiments. The fin structures $104_P$ are formed on the substrate 102 at the PMOS region 100P, and thus the fin structures $104_P$ are referred to as P-fin structures $104_P$, in accordance with some embodiments.

In the input/output region 200, the fin structures $204_N$ are formed on the substrate 202 at the NMOS region 200N, and thus the fin structures $204_N$ are referred to as N-fin structures $204_N$, in accordance with some embodiments. The fin structures $204_P$ are formed on the substrate 202 at the PMOS region 200P, and thus the fin structures $204_P$ are referred to as P-fin structures $204_P$, in accordance with some embodiments.

In some embodiments, the formation of the fin structures $104_N$, $104_P$, $204_N$ and $204_P$ includes patterning the semiconductor structure 20 using photolithography and etching processes to form trenches and the fin structures between the trenches. In some embodiments, an upper portion of the substrates 102 is patterned to form the N-fin structures $104_N$; the semiconductor material 101 is patterned to form the P-fin structures $104_P$; an upper portion of the substrates 202 is patterned to form the N-fin structures $204_N$; and the semiconductor material 201 is patterned to form the P-fin structures $204_P$.

In some embodiments, the N-fin structures $104_N$ and $204_N$ are Si fin or alternatively SiGe fin with a relatively low germanium percentage (such as less than about 20%), and the P-fin structures $104_P$ and 204P are SiGe fin with a relatively high germanium percentage (such as greater than about 20%). In some embodiments, the fin structures $104_N$, $104_P$, $204_N$ and $204_P$ extend in the X direction and are arranged in the Y direction.

Figure 2C:
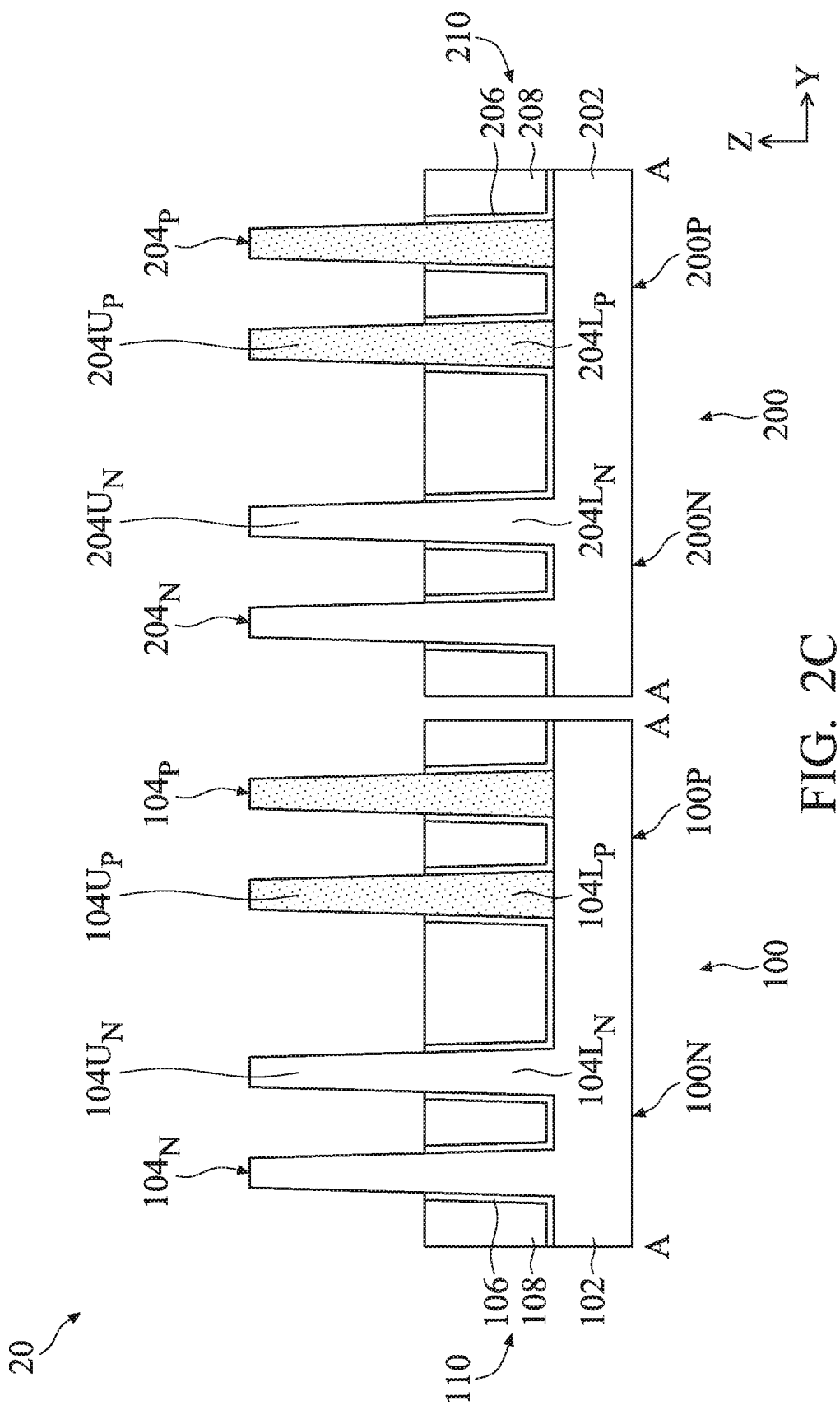

FIG. 2C is a cross-sectional view illustrating a semiconductor structure after the formation of an isolation structure, in accordance with some embodiments.

Isolation structures 110 and 210 are formed on the semiconductor structure 20, as shown in FIG. 2C, in accordance with some embodiments. In the core region 100, the isolation structure 110 is formed surrounding lower portions $104L_N$ of the N-fin structures $104_N$ and lower portions $104L_P$ of the P-fin structures $104_P$, in accordance with some embodiments. The portions of the fin structures $104_N$ and $104_P$ protruding from the isolation structure 110 are defined as upper portions $104U_N$ and $104U_P$.

In the input/output region 200, the isolation structure 210 is formed surrounding lower portions $204L_N$ of the N-fin structures $204_N$ and lower portions $204L_P$ of the P-fin structures $204_P$, in accordance with some embodiments. The portions of the fin structures $204_N$ and $204_P$ protruding from the isolation structure 210 are defined as upper portions $204U_N$ and $204U_P$.

In some embodiments, the isolation structure 110 includes lining layer 106 and insulating material 108, and the isolation structure 210 includes lining layer 206 and insulating material 208. In some embodiments, the lining layers 106 and 206 are made of silicon nitride, silicon oxide, multilayers thereof, another suitable material, or a combination thereof. In some embodiments, the insulating materials 108 and 208 are silicon oxide, silicon nitride, silicon oxynitride (SiON), another suitable material, and/or a combination thereof.

In some embodiments, the formation of the isolation structures 110 and 210 includes conformally formed the lining layers 106 and 206 along the substrates 102 and 202 and the fin structures $104_N$, $104_P$, $204_N$ and $204_P$, and depositing the insulating materials 108 and 208 over the lining layers 106 and 206 to cover the fin structures $104_N$, $104_P$, $204_N$ and $204_P$. In some embodiments, the lining layers 106 and 206 are formed using a thermal oxidation, atomic layer deposition (ALD), CVD, another suitable deposition technique, and/or a combination thereof. In some embodiments, the insulating materials 108 and 208 are formed using CVD (such as low pressure CVD (LPCVD), plasma enhanced CVD (PECVD), or high density plasma CVD (HDP-CVD), high aspect ratio process (HARP), flowable CVD (FCVD)), ALD, another suitable deposition technique, and/or a combination thereof.

A planarization process, such as chemical mechanical polishing (CMP), is performed on the semiconductor structure 20 to remove portions of the lining layers 106 and 206 and the insulating materials 108 and 208 formed above the upper surface of the fin structures $104_N$, $104_P$, $204_N$ and $204_P$ until the upper surfaces of the fin structures $104_N$, $104_P$, $204_N$ and $204_P$ are exposed, in accordance with some embodiments. Afterward, the lining layers 106 and 206 and the insulating materials 108 and 208 are etched back to expose the sidewalls of upper portions $104U_N$ of the N-fin structure $104_N$, upper portions $104U_P$ of the P-fin structure $104_P$, upper portions $204U_N$ of the N-fin structure $204_N$, and uppers portion $204U_P$ of the P-fin structure $204_P$, in accordance with some embodiments.

Figure 2D:
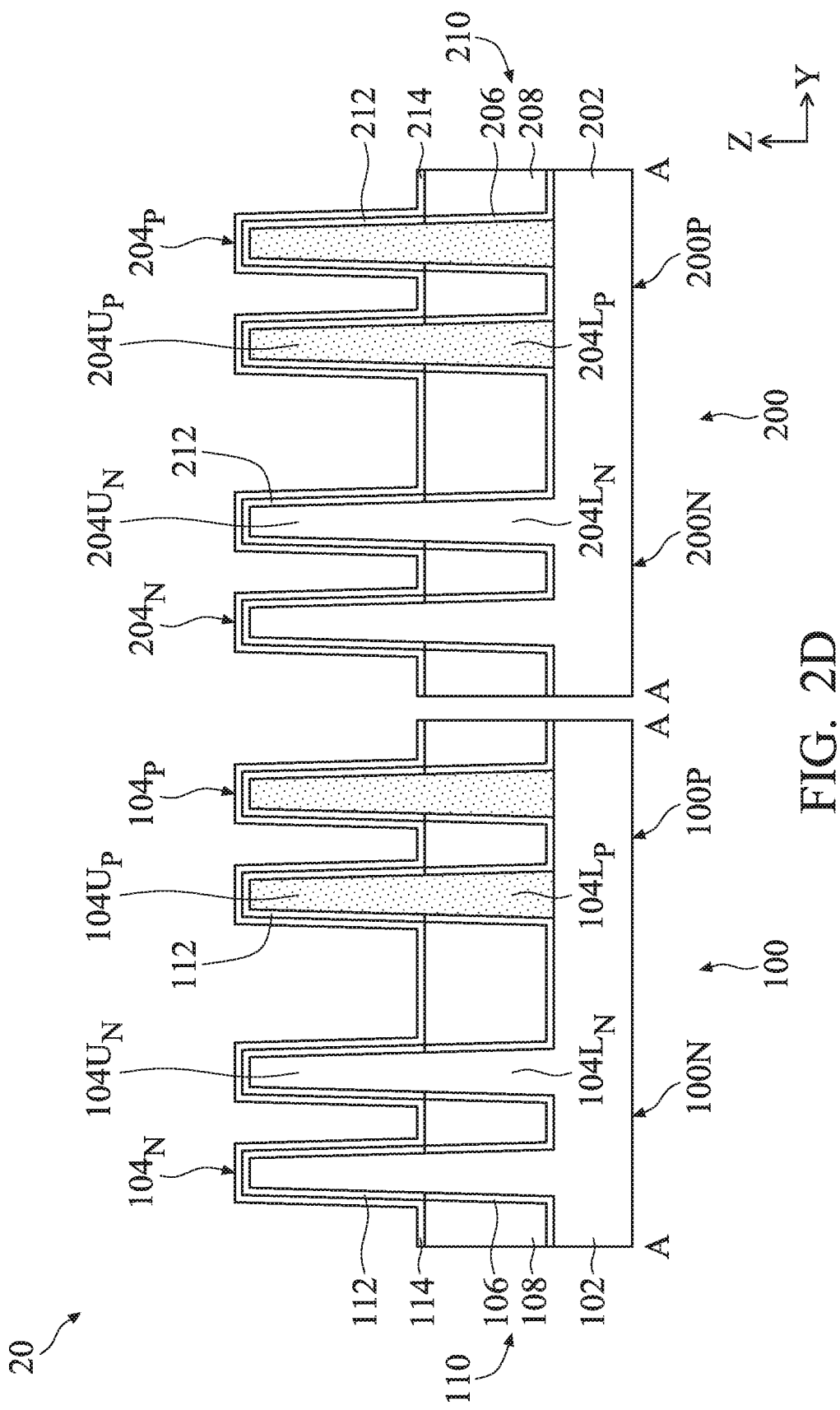

FIG. 2D is a cross-sectional view illustrating a semiconductor structure after the formation of a capping layer and an input/output gate dielectric layer, in accordance with some embodiments.

Capping layers 112 and 212 are formed over the semiconductor structure 20, as shown in FIG. 2D, in accordance with some embodiments. In the core region 100, the capping layer 112 is formed along the sidewalls and the upper surfaces of the upper portions $104U_N$ of the N-fin structures $104_N$ and the sidewalls and the upper surfaces of the upper portions $104U_P$ of the P-fin structures $104_P$.

In the input/output region 200, the capping layer 212 is formed along the sidewalls and the upper surfaces of the upper portions $204U_N$ of the N-fin structures $204_N$ and the sidewalls and the upper surfaces of the upper portions $204U_P$ of the P-fin structures $204_P$.

In some embodiments, the capping layer 112 and 212 are made of silicon. In some embodiments, the capping layers 112 and 212 have a thickness ranging from about 5 nm to about 15 nm. The capping layers 112 and 212 may be configured to improve the quality of the exposed surface of P-fin structures $104_P$ and $204_P$, thereby improving the mobility of the carrier of the resulting semiconductor device. In some embodiments, the capping layers 112 and 212 are grown at the semiconductor surface using an epitaxial growth technique.

Input/output gate dielectric layers 114 and 214 are formed over the semiconductor structure 20, as shown in FIG. 2D, in accordance with some embodiments. In the core region 100, the input/output gate dielectric layer 114 is conformally formed along the upper surface of the isolation structure 110 and formed over the capping layer 112 along the sidewalls and the upper surfaces of the upper portions $104U_N$ and the upper portions $104U_P$, in accordance with some embodiments. In some embodiments, the input/output gate dielectric layers 114 and 214 have a thickness ranging from about 20 nm to about 50 nm.

In the input/output region 200, an input/output gate dielectric layer 214 is conformally formed along the upper surface of the isolation structure 210 and formed over the capping layer 212 along the sidewalls and the upper surfaces of the upper portions $204U_N$ and the upper portions $204U_P$, in accordance with some embodiments.

In some embodiments, the input/output gate dielectric layers 114 and 214 are made of silicon oxide. In some embodiments, the input/output gate dielectric layers 114 and 214 are formed using ALD, CVD, another suitable deposition technique, and/or a combination thereof.

Figure 2E:
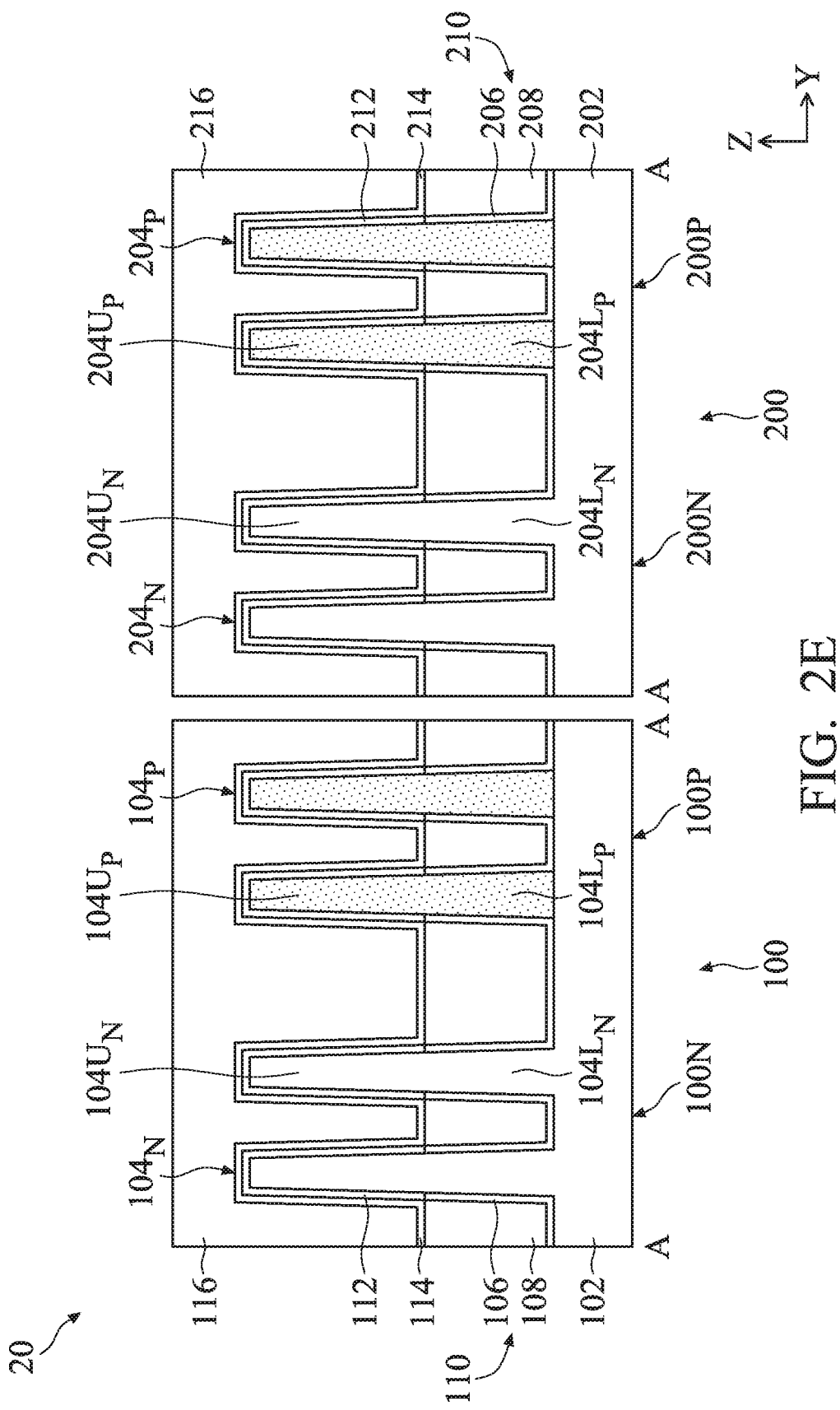
Figures 1, 2F:
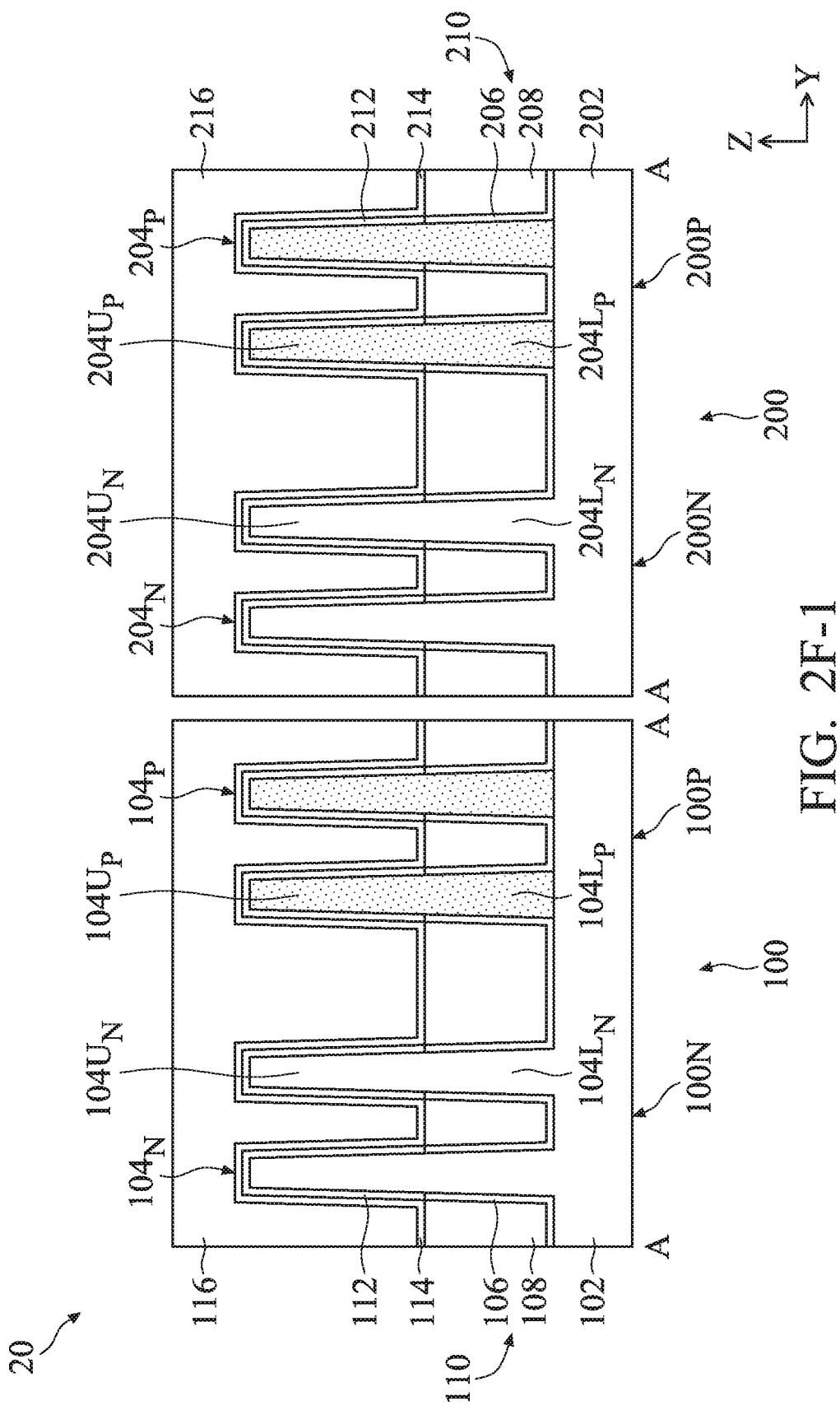
Figures 2, 2F:
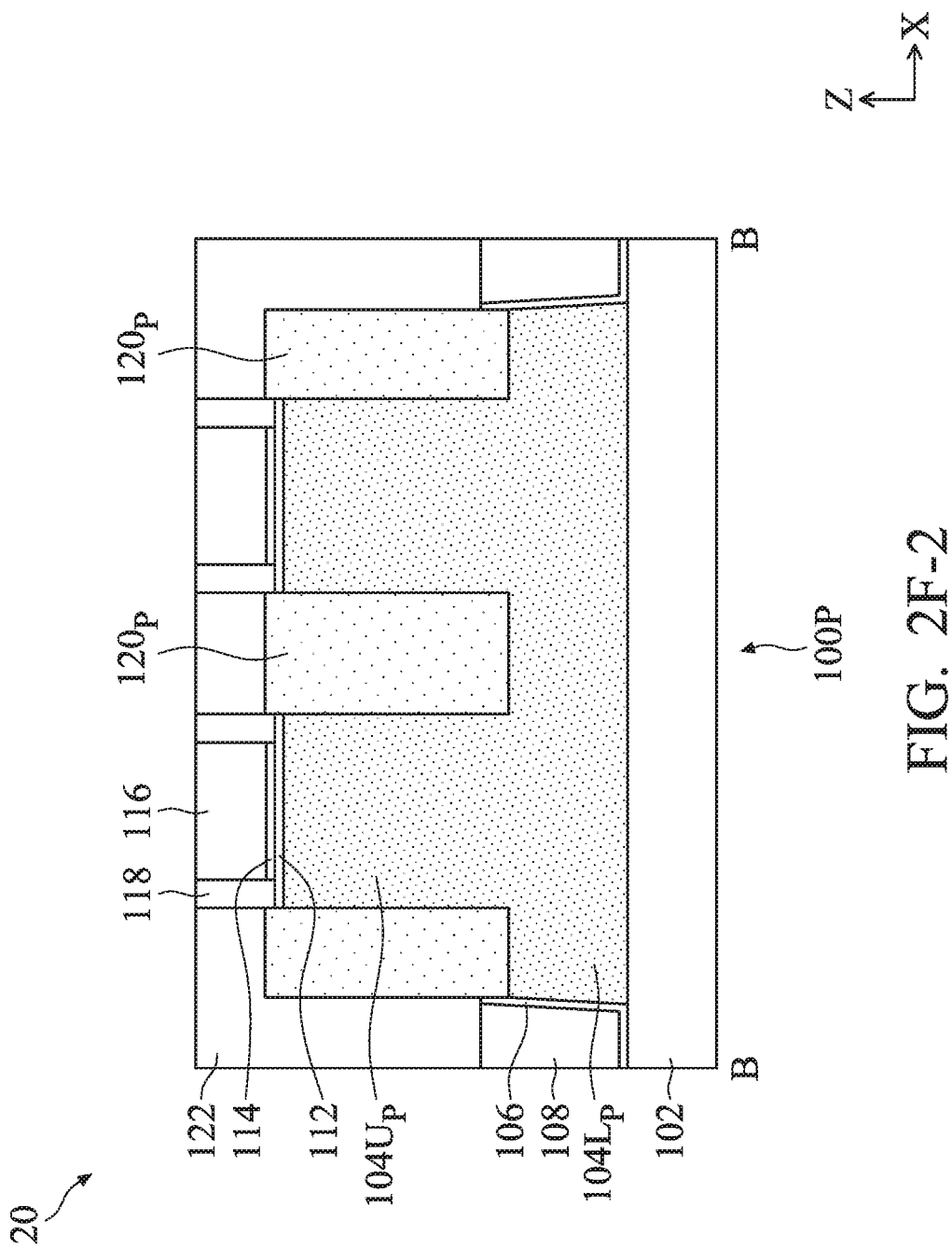
Figures 2, 2F, 3:
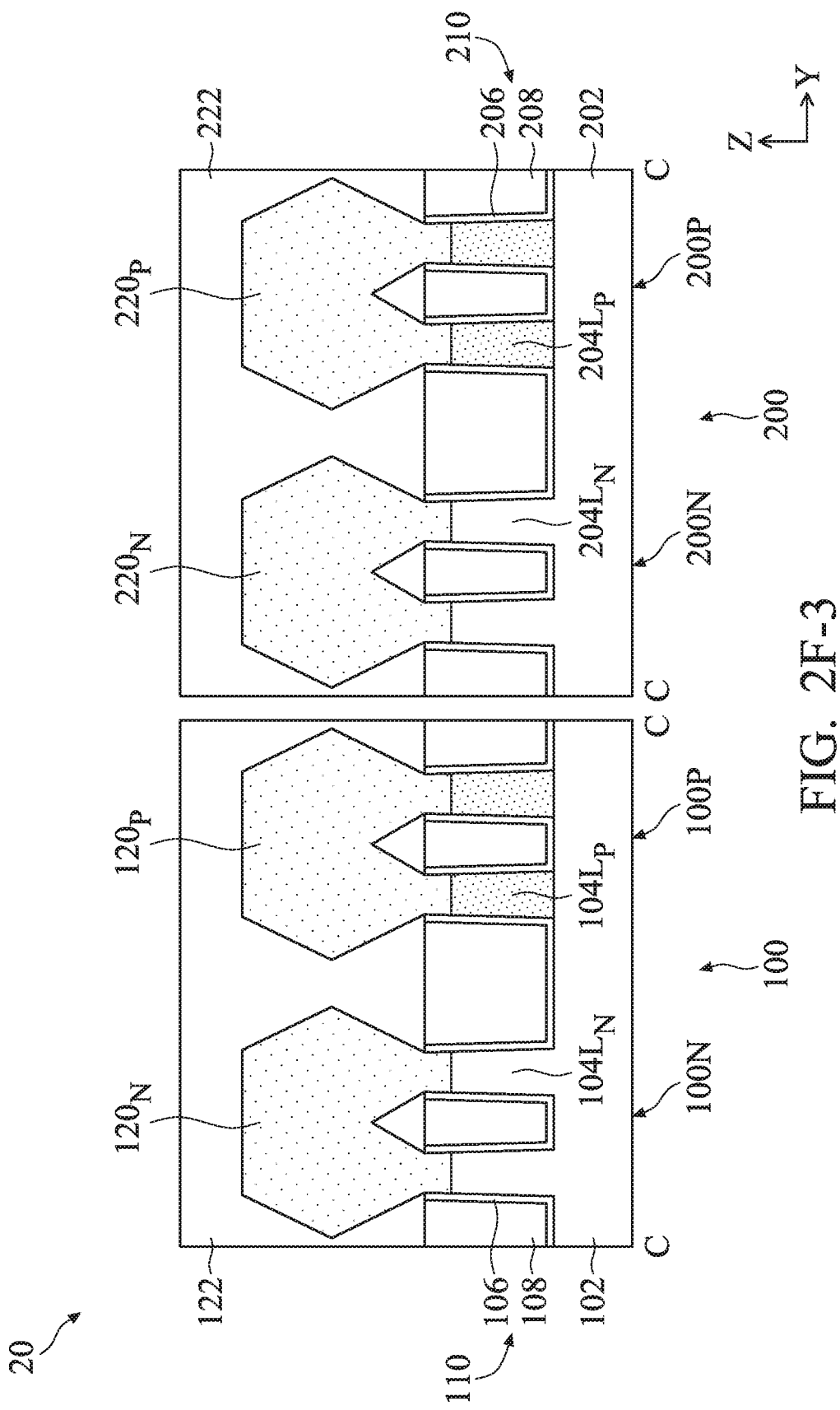

FIG. 2E is a cross-sectional view illustrating a semiconductor structure after the formation of a dummy gate electrode layer, in accordance with some embodiments.

Dummy gate electrode layers 116 and 216 are formed over the semiconductor structure 20, as shown in FIG. 2E, in accordance with some embodiments. In the core region 100, the dummy gate electrode layer 116 is formed over the input/output gate dielectric layer structures 114, in accordance with some embodiments. The dummy gate electrode layer 116 extends across the N-fin structures $104_N$ and the P-fin structures $104_P$ to wrap the channel region of the N-fin structures $104_N$ and the channel region of the P-fin structures $104_P$, in accordance with some embodiments.

In the input/output region 200, the dummy gate electrode layer 216 is formed over the input/output gate dielectric layer structures 214, in accordance with some embodiments. The dummy gate electrode layer 216 extends across the N-fin structures $204_N$ and the P-fin structures $204_P$ to wrap the channel region of the N-fin structures $204_N$ and the channel region of the P-fin structures $204_P$, in accordance with some embodiments.

In some embodiments, the dummy gate electrode layers 116 and 216 are made of a conductive material, such as polysilicon, poly-silicon germanium, metallic nitrides, metallic silicides, metals, and/or a combination thereof. In some embodiments, the formation of the dummy gate electrode layers 116 and 216 includes depositing a conductive material for the dummy gate electrode layers 116 and 216, planarizing the conductive material, and patterning the conductive material into the dummy gate electrode layers 116 and 216. The patterning process may include forming an etching mask (such as patterning hard mask layer or patterning photoresist layer, not shown) over the conductive material to cover the channel regions of the fin structures $104_N$, $104_P$, $204_N$ and $204_P$. The conductive material and the input/output gate dielectric layers 114 and 214 uncovered by the etching mask may be etched away to expose the source/drain regions of the fin structures $104_N$, $104_P$, $204_N$ and $204_P$.

In some embodiments, the dummy gate electrode layer 116 and the input/output gate dielectric layer 114 combine to form a dummy gate structure at the core region 100, and the dummy gate electrode layer 216 and the input/output gate dielectric layer 214 combine to form a dummy gate structure at the input/output region 200.

FIGS. 2F-1, 2F-2 and 2F-3 are cross-sectional views illustrating a semiconductor structure after the formation of a gate spacer layer, a source/drain feature and an inter-layer dielectric (ILD) layer, in accordance with some embodiments.

In the core region 100, a gate spacer layer 118 is formed along opposite sidewalls of the dummy gate structure (including the dummy gate electrode layer 116 and the input/output gate dielectric layer 114), as shown in FIG. 2F-2, in accordance with some embodiments. It should be noted that FIG. 2F-2 illustrates two dummy gate structures across two channel regions of one P-fin structure 100P. It should also be noted that, in the input/output region 200, a gate spacer layer is also formed along opposite sidewalls of the dummy gate structure (including the dummy gate electrode layer 216 and the input/output gate dielectric layer 214), although this is not shown in FIGS. 2F-1, 2F-2 and 2F-3.

In some embodiments, the gate spacer layer 118 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layer 118 includes conformally depositing a dielectric material for the gate spacer layer 118 over the semiconductor structure 20 followed by an anisotropic etching process such as dry etching.

Source/drain features $120_N$, $120_P$, $220_N$ and $220_P$ are formed over the semiconductor structure 20, as shown in FIGS. 2F-2 and 2F-3, in accordance with some embodiments. In the core region 100, the source/drain features $120_N$ are formed on the lower portions $104L_N$ of the N-fin structures $104_N$ at the source/drain region, in accordance with some embodiments. In some embodiments, the source/drain features $120_N$ on the adjacent N-fin structures $104_N$ merge to form a continuous source/drain feature. The source/drain features $120_P$ are formed on the lower portions $104L_P$ of the P-fin structures $104_P$ at the source/drain region, in accordance with some embodiments. In some embodiments, the source/drain features $120_P$ on the adjacent P-fin structures $104_P$ merge to form a continuous source/drain feature.

In the input/output region 200, the source/drain features $220_N$ are formed on the lower portions $204L_N$ of the N-fin structures $204_N$ at the source/drain region, in accordance with some embodiments. In some embodiments, the source/drain features $220_N$ on the adjacent N-fin structures $204_N$ merge to form a continuous source/drain feature. The source/drain features $220_P$ are formed on the lower portions $204L_P$ of the P-fin structures $204_P$ at the source/drain region, in accordance with some embodiments. In some embodiments, the source/drain features $220_P$ on the adjacent P-fin structures $204_N$ merge to form a continuous source/drain feature.

The formation of the source/drain features $120_N$, $120_P$, $220_N$, and $220_P$ includes recessing the fin structures $104_N$, $104_P$, $204_N$ and $204_P$ to form source/drain recesses at the source/drain regions, in accordance with some embodiments. The bottom surfaces of the source/drain recesses may extend to a position below the upper surface of the isolation structures 110 and 210. Afterward, the source/drain features $120_N$, $120_P$, $220_N$, and $220_P$ are grown on the fin structures $104_N$, $104_P$, $204_N$ and $204_P$ from the source/drain recesses using epitaxial growth processes, in accordance with some embodiments.

The source/drain features $120_N$, $120_P$, $220_N$, and $220_P$ may be formed separately for N-type semiconductor devices and P-type semiconductor devices, such as Ge, Si, GaAs, AlGaAs, SiGe, GaAsP, SiP, SiC, SiCP, or a combination thereof. In some embodiments, the source/drain features $120_N$, $120_P$, $220_N$, and $220_P$ are in-situ doped during the epitaxial growth processes.

ILD layers 122 and 222 are formed over the semiconductor structure 20, as shown in FIGS. 2F-2 and 2F-3, in accordance with some embodiments. In the core region 100, the ILD layer 122 is formed over the isolation structure 110 and the source/drain features $120_N$ and $120_P$, in accordance with some embodiments. In the input/output region 200, the ILD layer 222 is formed over the isolation structure 210 and the source/drain features $220_N$ and $220_P$, in accordance with some embodiments.

In some embodiments, the ILD layers 122 and 222 are made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the formation of the ILD layers 122 and 222 includes deposition one or more dielectric material for the ILD layers 122 and 222 over the semiconductor structure 20, and planarizing the dielectric material using such as CMP until the upper surfaces of the dummy gate structures are exposed. In some embodiments, the deposition process is CVD (such as HDP-CVD, PECVD, or HARP), ALD, another suitable method, and/or a combination thereof. The planarization process may also remove the etching mask (not shown) formed over the dummy gate electrode layer. In some embodiments, the upper surfaces of the ILD layers 122 and 222 are substantially coplanar with the upper surfaces of the dummy gate structures.

Figure 2G:
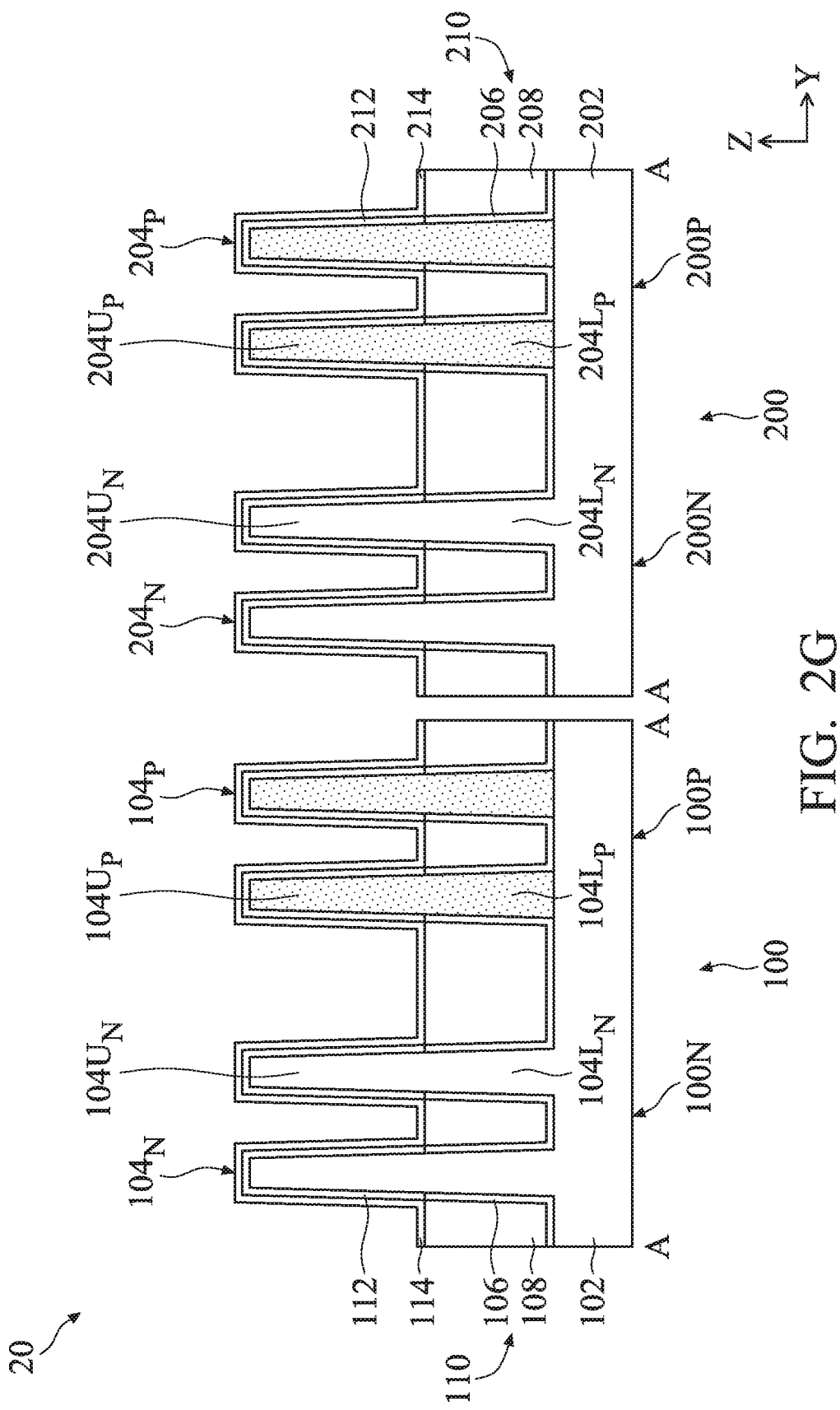

FIG. 2G is a cross-sectional view illustrating a semiconductor structure after a removal of a dummy gate electrode layer, in accordance with some embodiments.

The dummy gate electrode layers 116 and 216 are removed, as shown in FIG. 2G, in accordance with some embodiments. In the core region 100, the dummy gate electrode layer 116 is removed using an etching process to form gate trenches that expose the input/output gate dielectric layer 114, in accordance with some embodiments. In some embodiments, the gate spacer layers 118 are also exposed after the etching process.

In the input/output region 200, the dummy gate electrode layer 216 is removed using an etching process to form gate trenches that expose the input/output gate dielectric layer 214, in accordance with some embodiments. In some embodiments, the gate spacer layers, formed in the input/output region 200, are also exposed after the etching process.

Figure 2H:
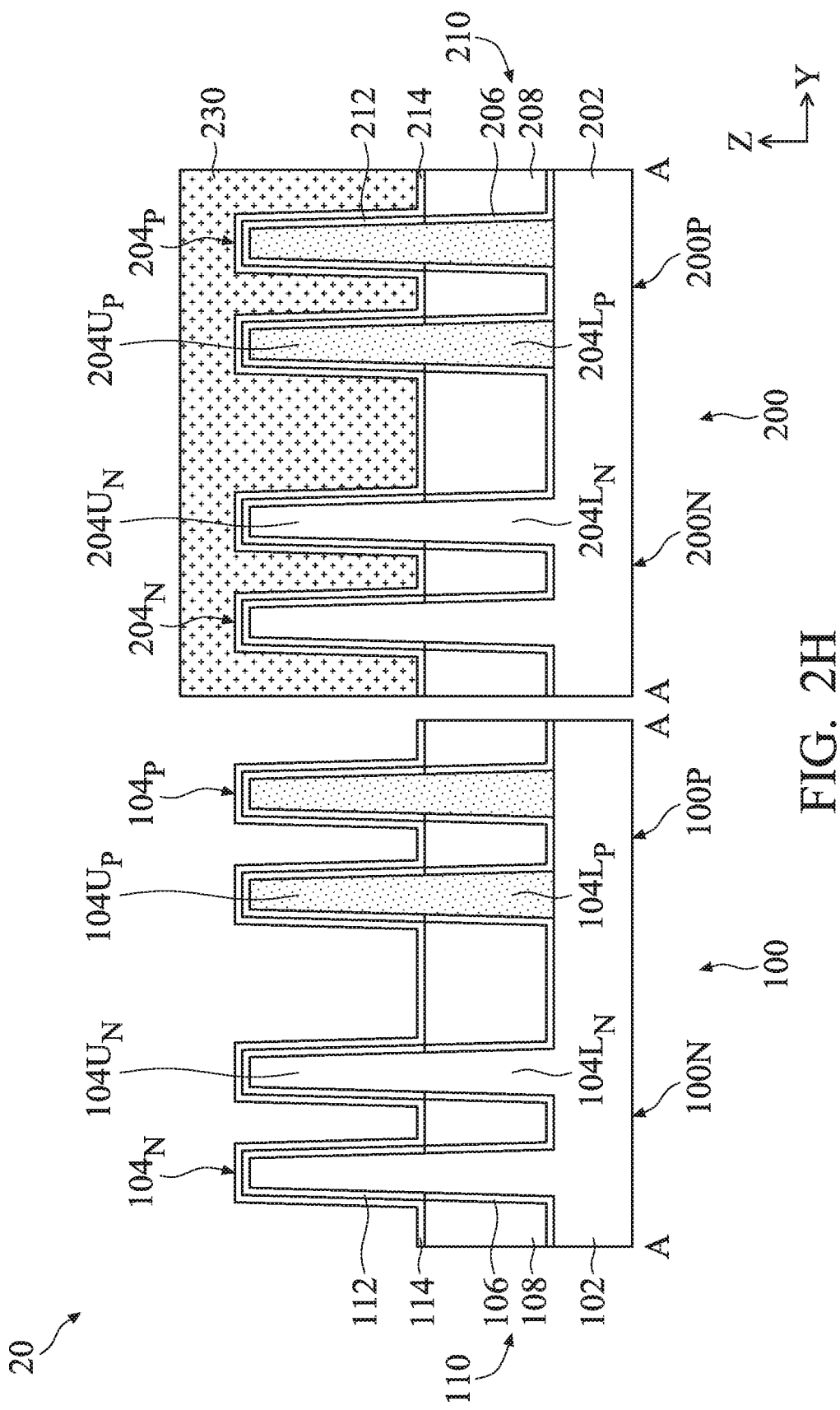

FIG. 2H is a cross-sectional view illustrating a semiconductor structure after the formation of a mask element, in accordance with some embodiments.

A mask element 230 is formed over the semiconductor structure 20, as shown in FIG. 2H, in accordance with some embodiments. The mask element 230 is formed over the input/output region 200 of the semiconductor structure 20 while the core region 100 of the semiconductor structure 20 is exposed, in accordance with some embodiments. In some embodiments, the mask element 230 covers the input/output gate dielectric layer 214, in accordance with some embodiments. The mask element 230 may also cover the ILD layer 216 and the gate spacer layer formed in the input/output region 200 (not shown in FIG. 2H).

In some embodiments, the mask element 230 is a patterning photoresist layer that is formed by a photolithography process. In some embodiments, the photolithography processes include resist coating (for example, spin-on coating), soft baking, mask aligning, exposure, post-exposure baking, developing the resist, rinsing, drying (for example, hard baking), and/or another suitable operation.

Figure 2I:
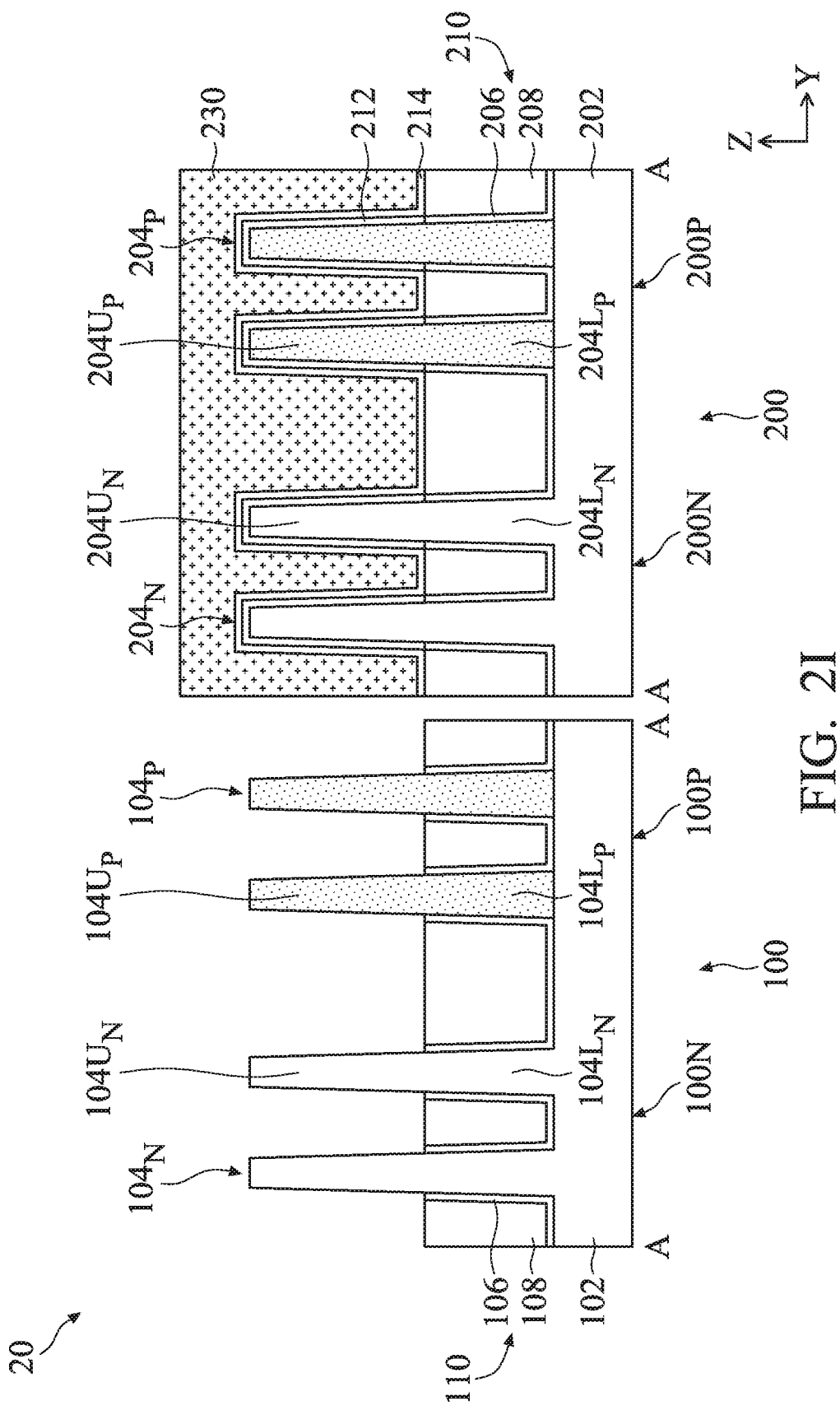

FIG. 2I is a cross-sectional view illustrating a semiconductor structure after an etching process, in accordance with some embodiments.

One or more etching processes are performed on the semiconductor structure 20 to remove the input/output gate dielectric layer 114 and the capping layer 112, as shown in FIG. 2I, in accordance with some embodiments. The one or more etching processes are performed until the semiconductor surface of the upper portions $104U_N$ at the channel region and the semiconductor surface of the upper portions $104U_P$ at the channel region are exposed, in accordance with some embodiments. The mask element 230 prevents the input/output gate dielectric layer 214 from being etched during the etching process, in accordance with some embodiments.

Figure 2J:
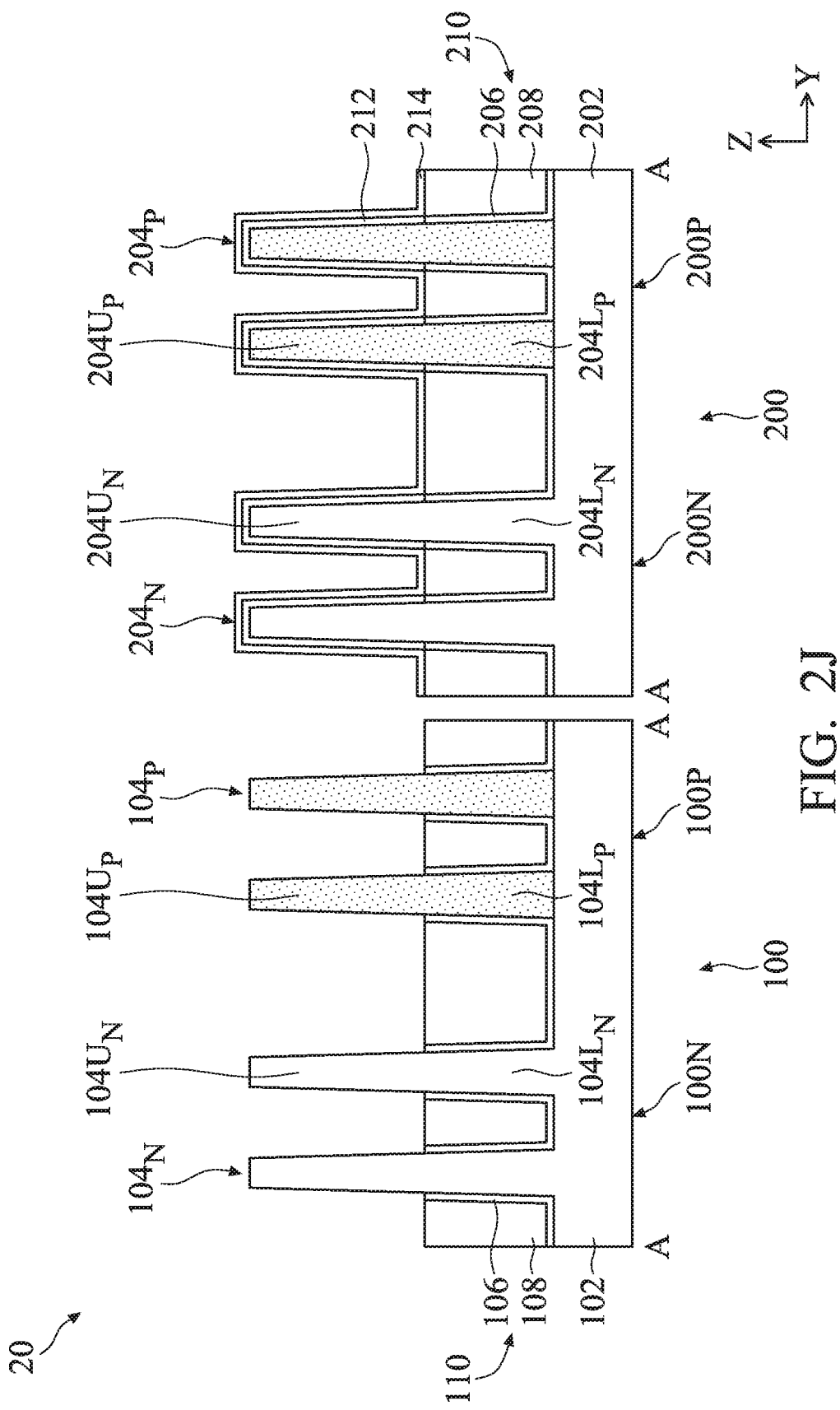

FIG. 2J is a cross-sectional view illustrating a semiconductor structure after the removal of the mask element, in accordance with some embodiments.

An etching process is performed on the semiconductor structure 20 to removes the mask element 230, as shown in FIG. 2J, in accordance with some embodiments. After the etching process, the input/output gate dielectric layer 214 is exposed, in accordance with some embodiments. In some embodiments, during the etching process, the semiconductor material of the fin structures $104_N$ and $104_P$ has a different etching selectivity than the mask element, and thus the fin structures $104_N$ and $104_P$ are substantially unetched. In some embodiments, the etching process is a wet etching using an etchant such as a sulfuric acid peroxide mixture (SPM, $H_2SO_4+H_2O_2$).

Figure 2K:
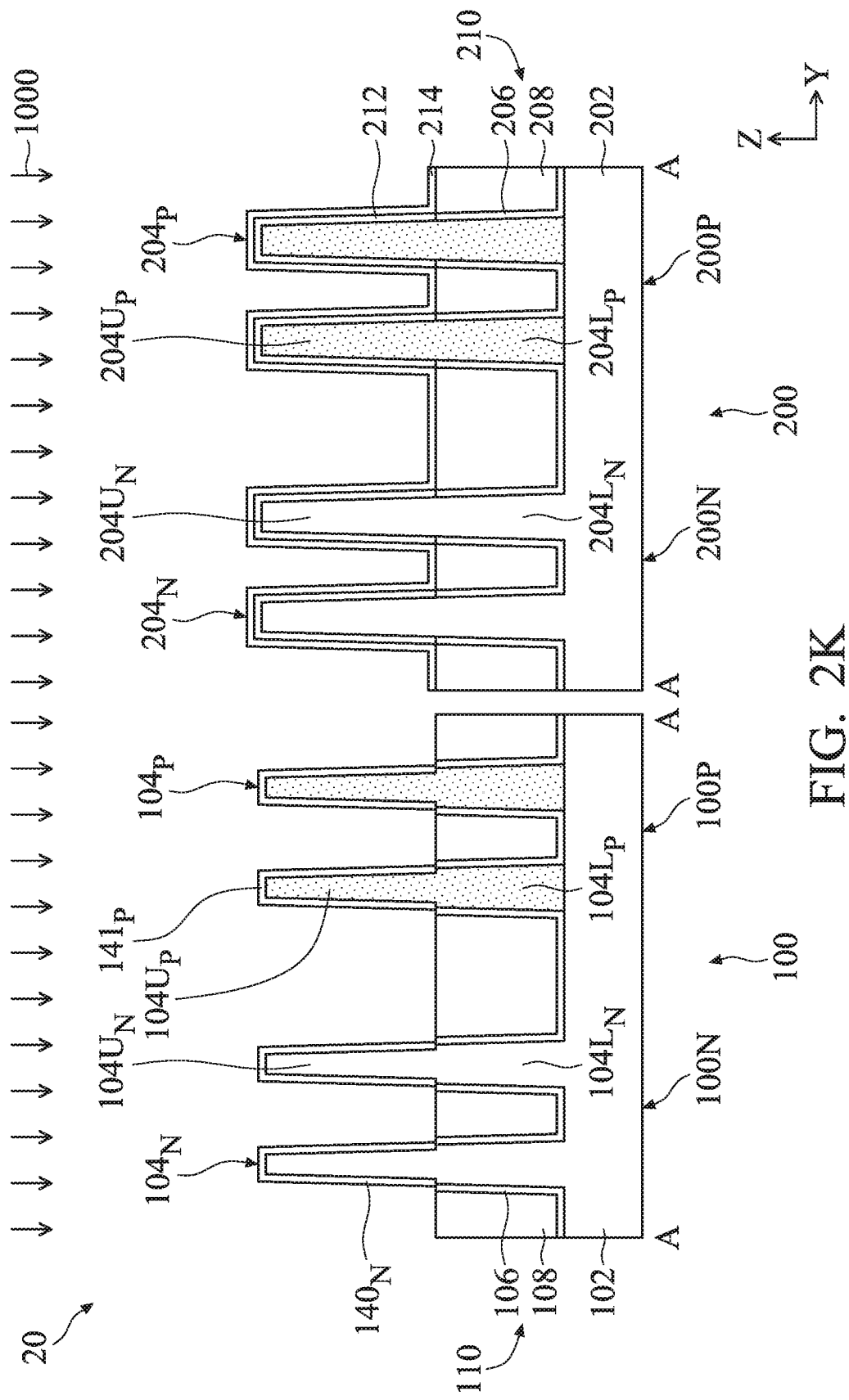
Figure 2L:
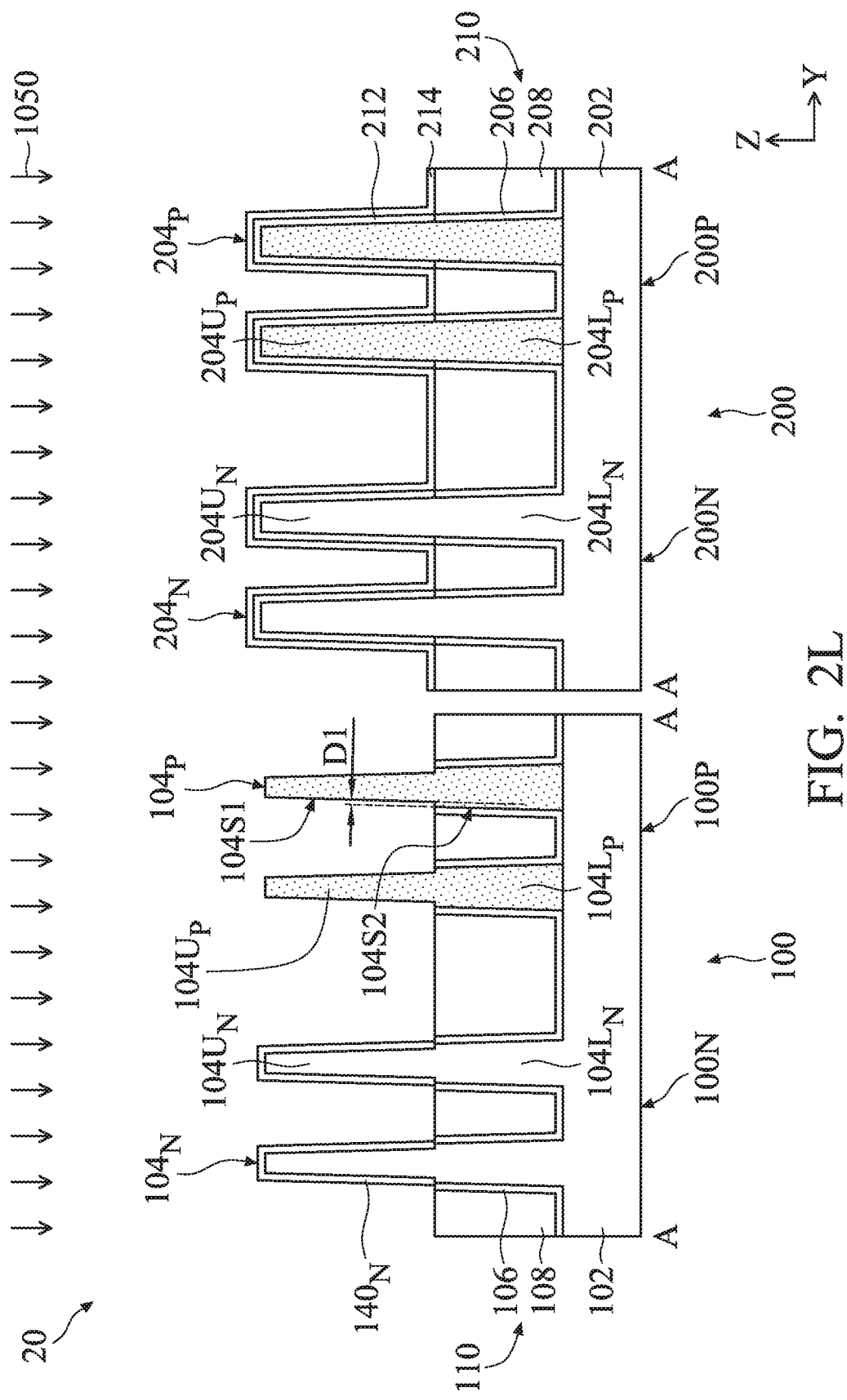

FIGS. 2K and 2L are a cross-sectional view illustrating a trimming process performed on a semiconductor structure, in accordance with some embodiments.

The semiconductor structure 20 is subjected to a selective trimming process in which the P-fin structures $104_P$ are trimmed while the N-fin structures $104_N$, the N-fin structures $204_N$ and the P-fin structures $204_P$ remain untrimmed, in accordance with some embodiments.

The selective trimming process includes performing an oxidation process 1000 on the semiconductor structure 20, as shown in FIG. 2K, in accordance with some embodiments. The exposed semiconductor surface of the N-fin structures $104_N$ is oxidized in the oxidation process 1000, such that silicon oxide layers $140_N$ are formed on the sidewalls and the upper surfaces of the upper portions $104U_N$ of the N-fin structures $104_N$ at the channel region, in accordance with some embodiments. In some embodiments, the silicon oxide layers $140_N$ has a thickness ranging from about 0.5 nm to about 4 nm.

The exposed semiconductor surface of the P-fin structures $104_P$ is oxidized in the oxidation process 1000, such that germanium oxide layers $141_P$ are formed on the sidewalls and the upper surfaces of the upper portions $104U_P$ of the P-fin structures $104_P$ at the channel region, in accordance with some embodiments. In some embodiments, the germanium oxide layers $141_P$ has a thickness ranging from about 0.5 nm to about 4 nm.

The upper portions $104U_N$ and $104U_P$ of the fin structures $104_N$ and $104_P$, covered by the gate spacer layer 118 (FIG. 2F-2), are not oxidized during the oxidation process 1000, in accordance with some embodiments.

In some embodiments, the oxidation process 1000 includes a wet oxidation process, a dry oxidation process, and/or a combination thereof. For example, the wet oxidation process may use an etchant such as ozone ($O_3$)-containing solution (such as $O_3$+deionized water). For example, the dry oxidation process may be a dry plasma process using oxygen plasma.

During the oxidation process 1000, the silicon from the N-fin structures $104_N$ is consumed by and reacts with the oxygen provided by the oxidation process 1000 to convert to the silicon oxide layers $140_N$, in accordance with some embodiments. In some embodiments where the N-fin structures $104_N$ are made of SiGe, because the germanium concentration of the N-fin structures $104_N$ is low (e.g., <20%), the oxide layers $140_N$ are still silicon oxide. During the oxidation process 1000, the germanium from the P-fin structures $104_P$ is consumed by and reacts with the oxygen provided by the oxidation process 1000 to convert to the germanium oxide layers $141_P$, in accordance with some embodiments.

The selective trimming process further includes performing an etching process 1050 on the semiconductor structure 20, as shown in FIG. 2L, in accordance with some embodiments. The etching process 1050 selectively removes the germanium oxide layers $141_P$ formed on the P-fin structures $104_P$ until the semiconductor surface of the upper portions $104U_P$ of the P-fin structures $104_P$ are exposed, in accordance with some embodiments. As such, after the etching process 1050, the channel region of the P-fin structures $104_P$ has been trimmed, in accordance with some embodiments. In some instances, the mask element 230 (FIGS. 2H and 2I) may remain in the input/output region 200 during the trimming process and may be removed after the etching process 1050.

In some embodiments, the upper portion $104U_P$ of the P-fin structure $104_P$ has a first sidewall 104S1 that is located, for example, at the left side of the P-fin structure $104_P$, and the lower portion $104L_P$ of the P-fin structure $104_P$ has a second sidewall 104S2 that is located at the same side as the first sidewall 104S1, for example, at the left side of the P-fin structure $104_P$. The first sidewall 104S1 is indented from the second sidewall 104S2 by a distance D1 that is in a range from about 0.5 nm to about 4 nm.

In some embodiments, the etching process 1050 is a wet etching using an alkaline solution. For example, the alkaline solution may be ammonium hydroxide ($NH_4OH$), tetramethylammonium hydroxide (TMAH), or/and potassium hydroxide (KOH). In some embodiments where the etching process 1050 uses ammonium hydroxide ($NH_4OH$) as etchant, the etching process 1050 is performed at room temperature (about 25° C.) or a temperature in a range from about 40° C. to about 70° C. and for a duration in a range from about 5 seconds to about 100 seconds.

In the etching process 1050, the silicon-oxide-based material layers (e.g., the silicon oxide layer $140_N$, the input/output gate dielectric layer 214, the gate spacer layer 118, the isolation structures 110 and 210, and the ILD layers 122 and 222) have a different etching selectivity than the germanium oxide layer $141_P$, in accordance with some embodiments. That is, in some embodiments, the etching rates of the silicon-oxide-based material layers (e.g., the silicon oxide layer $140_N$, the input/output gate dielectric layer 214, the gate spacer layer 118, the isolation structures 110 and 210, and the ILD layers 122 and 222) is much lower than the etching rate of the germanium oxide layer $141_P$, in accordance with some embodiments. For example, the etching selectivity (e.g., a ratio of the etching rate of germanium oxide to the etching rate of silicon oxide) may be in a range from about 2 to about 50. In some embodiments, the silicon-oxide-based material layers are substantially unetched during the etching process 1050. As such, the N-fin structures $104_N$ underlying the silicon oxide layer $140_N$ and the N-fin structures $204_N$ and the P-fin structures $204_P$ underlying the input/output gate dielectric layer 214 remain untrimmed during the etching process 1050, in accordance with some embodiments.

Furthermore, the gate spacer layer 118 and the isolation structures 110 and 210 are substantially unetched during the etching process 1050, which may provide benefits, in some embodiments, one or more of (1) keeping the critical dimension of the gate structure (the spacing between the gate spacer layers), (2) keeping the height of the fin structure protruding from the isolation structure (i.e., the upper portion of the fin), (3) a better control of following manufacturing processes, (4) the lower parasitic capacitance between the metal gate stack and the source/drain feature, and/or (5) mitigation to the metal gate protrusion issue.

Figure 2M:
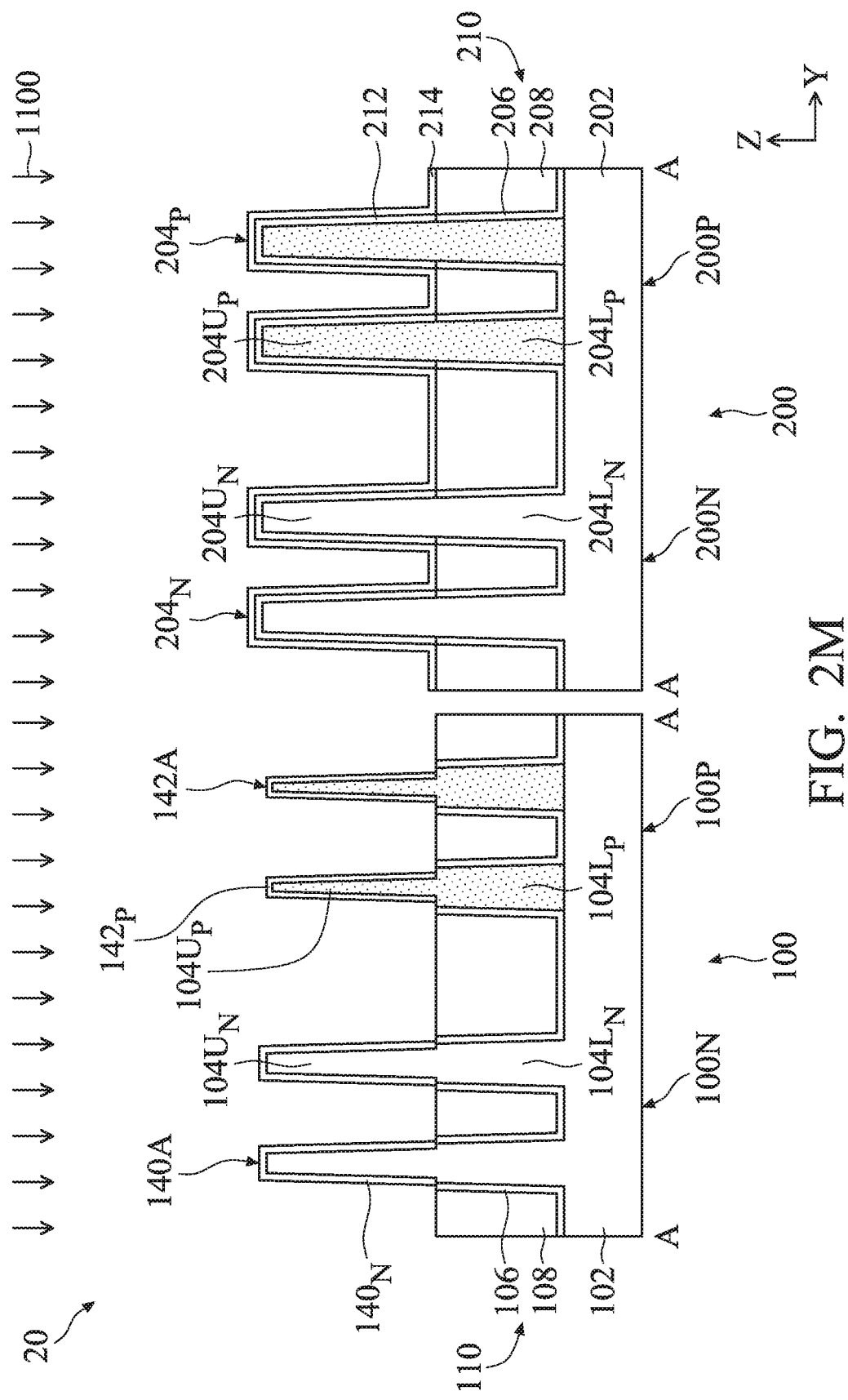
Figures 1, 2N:
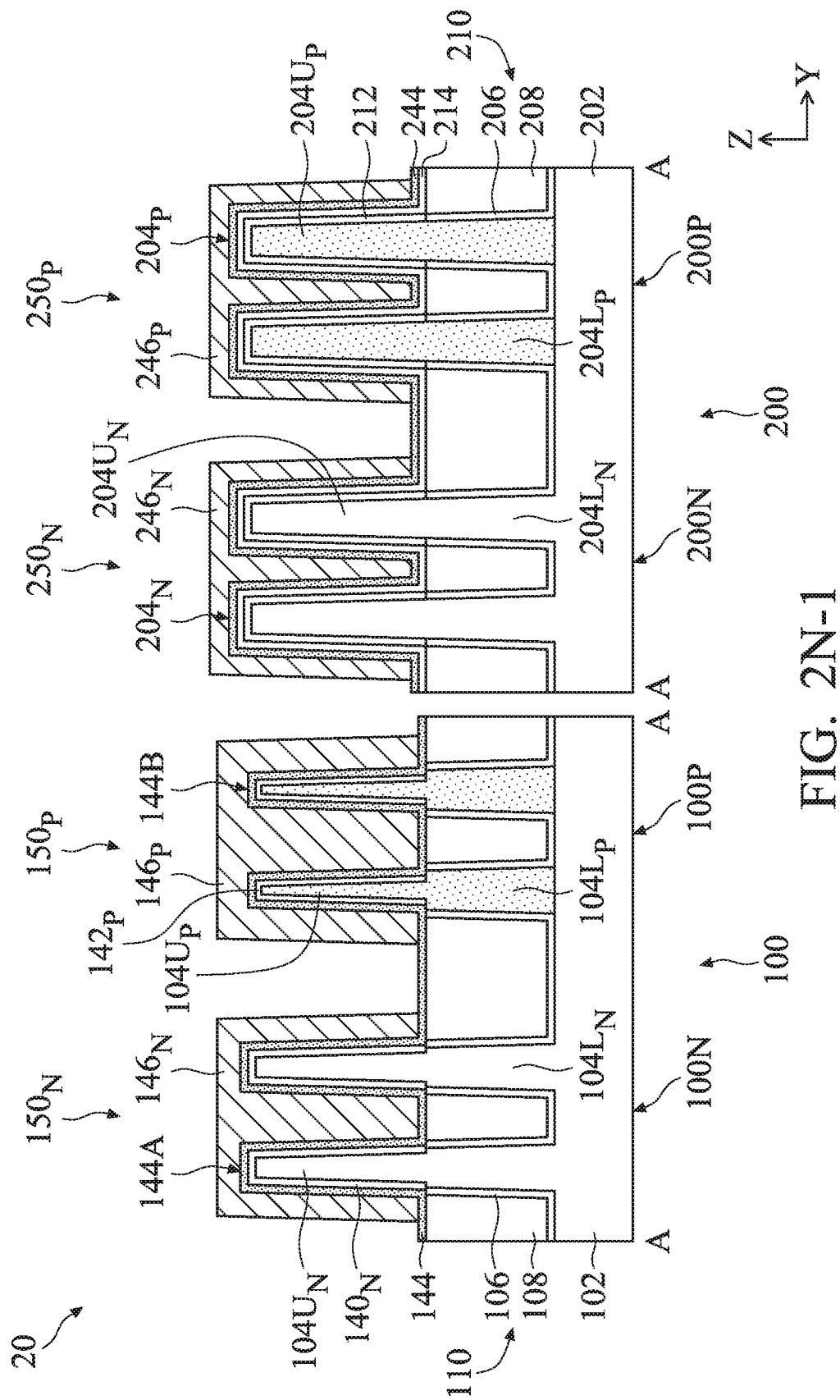
Figures 2, 2N:
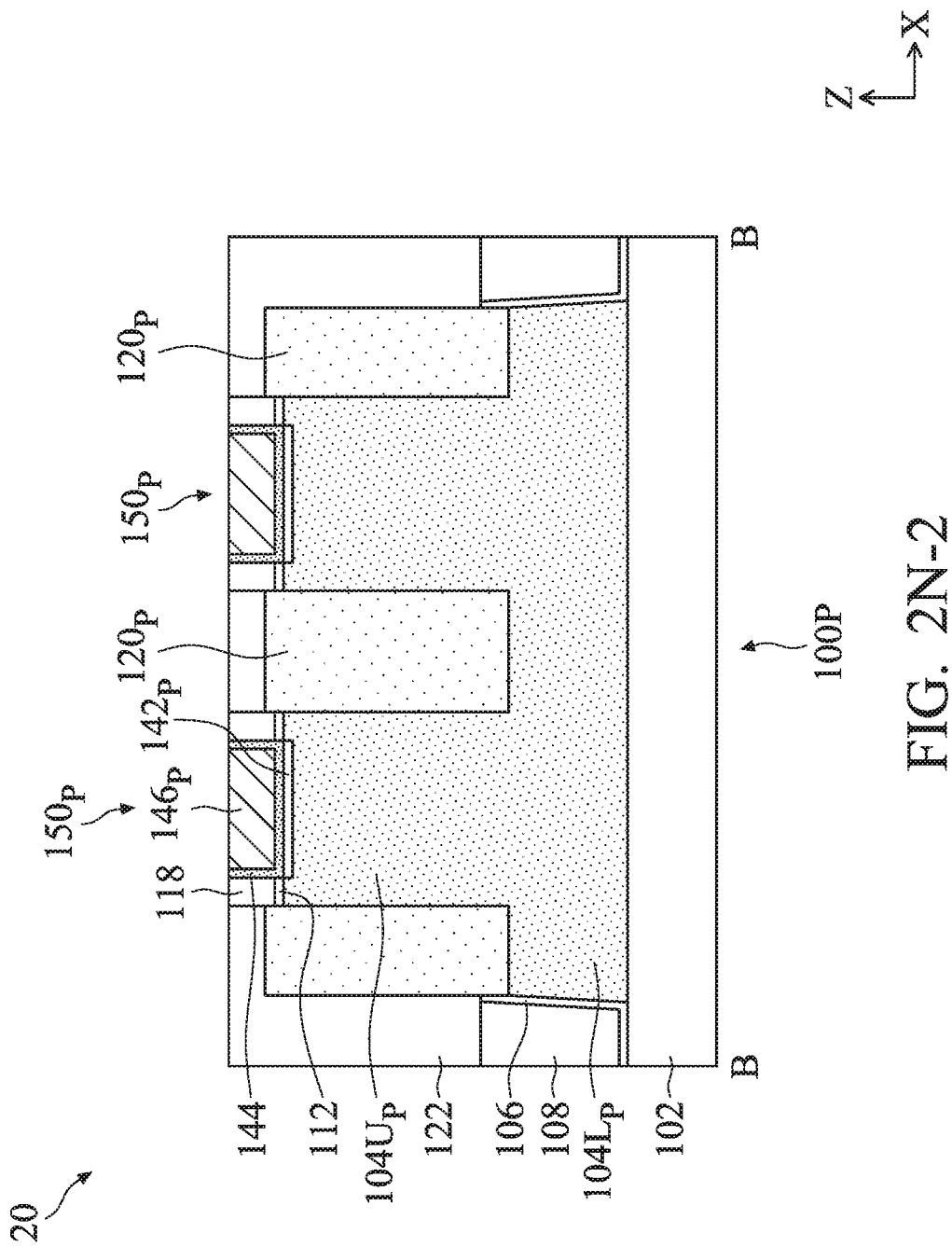

FIG. 2M is a cross-sectional view illustrating a semiconductor structure after an oxidation process, in accordance with some embodiments.

An oxidation process 1100 is performed on the semiconductor structure 20, in accordance with some embodiments. The exposed semiconductor surface of the P-fin structures $104_P$ is oxidized in the oxidation process 1100, such that interfacial layers $142_P$ are formed on the sidewalls and the upper surfaces of the upper portions $104U_P$ of the P-fin structures $104_P$, in accordance with some embodiments. In some embodiments, the interfacial layers $142_P$ are germanium oxide or silicon germanium oxide. In some embodiments, the interfacial layers $142_P$ has a thickness ranging from about 6 angstroms (Å) to about 15 Å.

In some embodiments, the oxidation process 1100 includes a wet clean process using ozone ($O_3$)-containing solution. The oxidation process 1100 may further enhance the quality of the silicon oxide layer $140_N$. The silicon oxide layer $140_N$ can be used as the interfacial layer for a subsequently formed metal gate stack, in accordance with some embodiments. The interfacial layer is configured to provide a high-quality interface (e.g., SiGeO/SiGe interface and SiO/Si interface) for the metal gate process, in accordance with some embodiments.

Because the P-fin structure $104_P$ is trimmed while the N-fin structure $104_N$ remains untrimmed, a portion of the interfacial layer $140_N$ formed on the upper surface of the N-fin structure $104_N$ is located at a higher position than a portion of the interfacial layer $142_P$ formed on the upper surface of the P-fin structure $104_P$. In some embodiments, the interfacial layer $140_N$ has an upper surface 140A at the channel region and the interfacial layer $142_P$ has an upper surface 142A at the channel region, as shown in FIG. 2M. In some embodiments, the upper surface 140A of the interfacial layer $140_N$ is located at a higher position than the upper surface 142A of the interfacial layer $142_P$.

FIGS. 2N-1 and 2N-2 are cross-sectional views illustrating a semiconductor structure after the formation of metal gate stacks, in accordance with some embodiments.

Core gate dielectric layers 144 and 244 are formed over the semiconductor structure 20, as shown in FIGS. 2N-1 and 2N-2, in accordance with some embodiments. In the core region 100, the core gate dielectric layer 144 is conformally formed along the interfacial layer $140_N$ and the interfacial layer $142_P$, in accordance with some embodiments. The core gate dielectric layer 144 is further conformally formed along the upper surface of the isolation structure 110 and the sidewalls of the gate spacer layer 118, in accordance with some embodiments. In some embodiments, the core gate dielectric layers 144 and 244 have a thickness ranging from about 12 Å to about 30 Å. In some embodiments, the core gate dielectric layers 144 and 244 are thinner than the input/output gate dielectric layer 214.

In the input/output region 200, the core gate dielectric layer 244 is conformally formed along the input/output gate dielectric layer 214, in accordance with some embodiments. The core gate dielectric layer 244 is further conformally formed along the upper surface of the isolation structure 210, in accordance with some embodiments. It should be noted that the core gate dielectric layer 244 is further formed along the sidewalls of the gate spacer layer in the input/output region 200, although this is not shown in FIGS. 2N-1 and 2N-2.

In some embodiments, the core gate dielectric layers 144 and 244 are made of a high-k dielectric material with dielectric constant (k value), for example, greater than 3.9. In some embodiments, the high-K dielectric material includes hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or another suitable material. In some embodiments, the core gate dielectric layers 144 and 244 are formed using ALD, CVD, physical vapor deposition (PVD), another suitable deposition technique, and/or a combination thereof.

Because the channel region of the P-fin structure $104_P$ is trimmed while the channel region of the N-fin structure $104_N$ remains untrimmed, a portion of core gate dielectric layer 144 formed over the upper surface of the N-fin structure $104_N$ is located at a higher position than a portion of the core gate dielectric layer 144 formed over the upper surface of the P-fin structure $104_P$. In some embodiments, the core gate dielectric layer 144 formed over the channel region of the N-fin structure $104_N$ has an upper surface 144A and the core gate dielectric layer 144 formed over the channel region of the P-fin structure $104_P$ has an upper surface 144B, as shown in FIG. 2N-1. In some embodiments, the upper surface 144A of the core gate dielectric layer 144 is located at a higher position that is than the surface upper 144B of the core gate dielectric layer 144.

Metal gate electrode layers $146_N$, $146_P$, $246_N$ and $246_P$ are formed over the semiconductor structure 20, as shown in FIGS. 2N-1 and 2N-2, in accordance with some embodiments.

In the NMOS region 100N of the core region 100, the metal gate electrode layer $146_N$ is formed over the core gate dielectric layer 144 and across the N-fin structures $104_N$ to wrap the channel regions of the N-fin structures $104_N$, in accordance with some embodiments. In some embodiments, the metal gate electrode layer $146_N$ together with the core gate dielectric layer 144 and the interfacial layer $140_N$ forms N-type core metal gate stack. The N-type core metal gate stack interposes the source/drain features $120_N$ (FIGS. 2F-3) and combines with source/drain features $120_N$ to form N-type core semiconductor devices $150_N$ (such as N-FINFETs), in accordance with some embodiments.

In the PMOS region 100P of the core region 100, the metal gate electrode layer $146_P$ is formed over the core gate dielectric layer 144 and across the P-fin structures $104_P$ to wrap the channel regions of the P-fin structures $104_P$, in accordance with some embodiments. In some embodiments, the metal gate electrode layer $146_P$ together with the core gate dielectric layer 144 and the interfacial layer $142_P$ forms P-type core metal gate stack. The P-type core metal gate stack interposes the source/drain features $120_P$ and combines with the source/drain features $120_P$ to form P-type core semiconductor devices $150_P$ (such as P-FINFETs), in accordance with some embodiments.

In the NMOS region 200N of the input/output region 200, the metal gate electrode layer $246_N$ is formed over the core gate dielectric layer 244 and across the N-fin structures $204_N$ to wrap the channel regions of N-the fin structures $204_N$, in accordance with some embodiments. In some embodiments, the metal gate electrode layer $246_N$ together with the core gate dielectric layer 244 and the input/output gate dielectric layer 214 forms N-type input/output metal gate stack. The N-type input/output metal gate stack interposes the source/drain features $220_N$ (FIGS. 2F-3) and combines with source/drain features $220_N$ to form N-type input/output semiconductor devices $250_N$ (such as N-FINFETs), in accordance with some embodiments.

In the PMOS region 200P of the input/output region 200, the metal gate electrode layer $246_P$ is formed over the core gate dielectric layer 244 and across the P-fin structures $204_P$ to wrap the channel regions of the P-fin structures $204_P$, in accordance with some embodiments. In some embodiments, the metal gate electrode layer $246_P$ together with the core gate dielectric layer 244 and the input/output gate dielectric layer 214 forms P-type input/output metal gate stack. The P-type input/output metal gate stack interposes the source/drain features $220_P$ (FIGS. 2F-3) and combines with the source/drain features $220_P$ to form P-type input/output semiconductor devices $250_P$ (such as P-FINFETs), in accordance with some embodiments.

In some embodiments, the metal gate electrode layers 146N, 146P, 246N and 246P are made one or more conductive materials, such as a metal, metal alloy, or metal silicide. In some embodiments, the electrode material is a single layer or alternatively a multi-layer structure, such as various combinations of a metal layer with a selected work function to enhance the device performance (work function metal layer), a liner layer, a wetting layer, an adhesion layer, a metal fill layer, and/or another suitable layer. For example, the gate electrode layer may be made of doped polysilicon, doped poly-germanium, Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

In some embodiments, the metal gate electrode layers 146N, 146P, 246N and 246P are formed by depositing one or more conductive materials for gate electrode layers to fill the gate trenches that were previously occupied by the dummy gate electrode layers 116 and 216. In some embodiments, the conductive materials and the core gate dielectric layers, formed above the ILD layers 122 and 222, are removed until the upper surfaces of the ILD layers 122 and 222 are exposed. Furthermore, the metal gate electrode layers 146N, 146P, 246N and 246P may be formed separately for N-type semiconductor device and P-type semiconductor device which may use different gate electrode materials and/or different work function materials. Afterword, a cutting process may be performed on the metal gate electrode layers 146N, 146P, 246N and 246P.

The embodiments of the present disclosure provide a selective trimming process for the P-fin structure, which may provide benefits, in some embodiments, one or more of (1) improving the short channel effect (SCE) and reducing the drain induced barrier lowering (DIBL) of the P-type semiconductor devices, and/or (2) independent adjustment of the performance (e.g., threshold voltage) of the N-type semiconductor devices and the P-type semiconductor devices.

Furthermore, the trimming process may allow that the fin structure may be fabricated initially with a larger dimension (e.g., the width along the Y direction) or a lower aspect ratio (height/width). As such, fin bending and collapse may be less of a concern. Moreover, because the fin structure has a larger width initially, the source/drain feature formed thereon may be formed to have a larger dimension, thereby reducing the resistance of contact to source/drain.

Figure 2O:
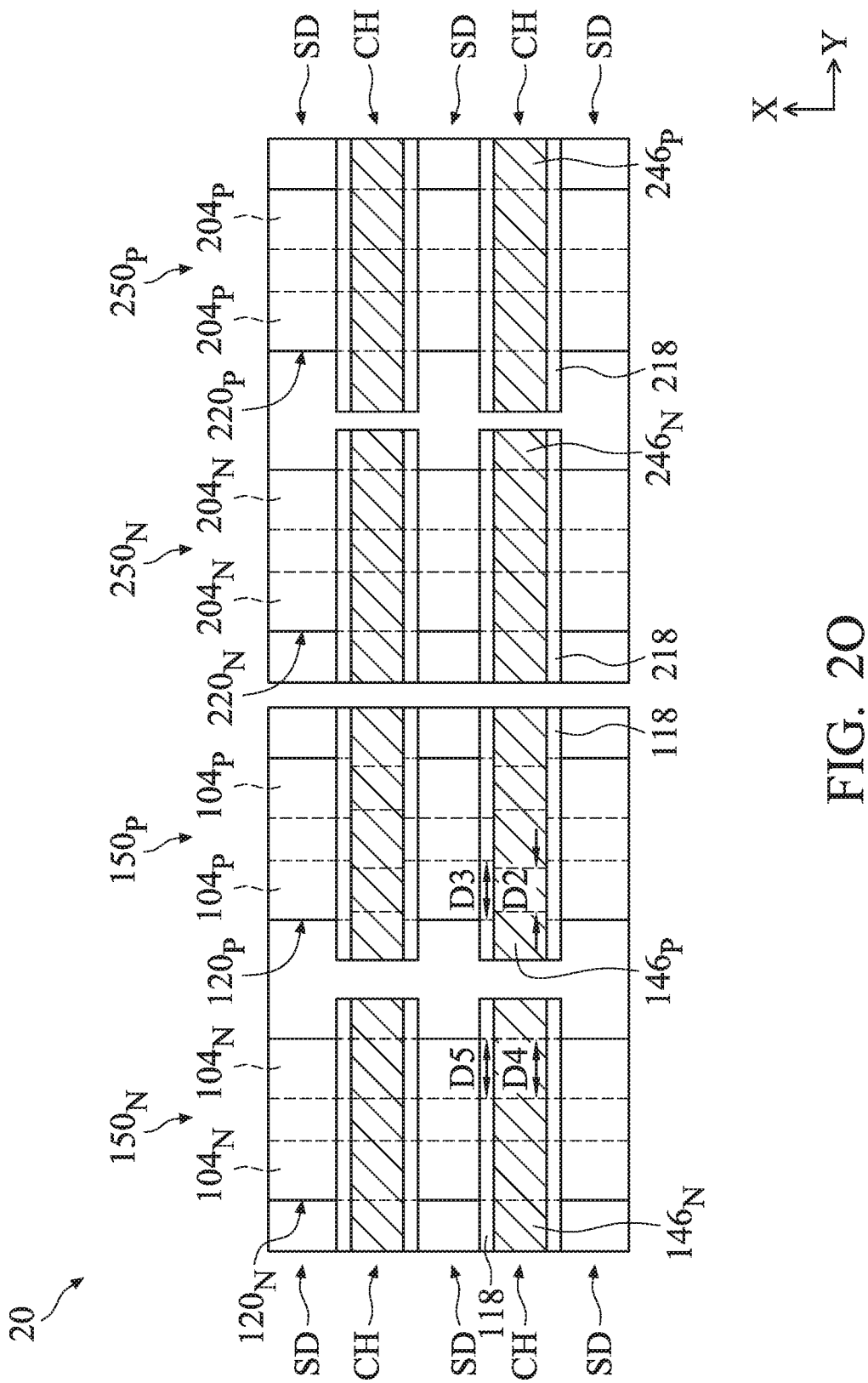
FIG. 2O is a top view of the semiconductor structure of FIGS. 2N-1 and 2N-2, in accordance with some embodiments of the disclosure.

FIG. 2O is a top view of the semiconductor structure 20 of FIGS. 2N-1 and 2N-2, in accordance with some embodiments of the disclosure. For the sake of simplicity and clarity, FIG. 2O only shows fin structures, gate spacer layers, source/drain features, and metal gate electrode. It should be noted that FIG. 2O also shows the gate spacer layer 218 of the input/output semiconductor devices $250_N$ and $250_P$.

The P-fin structure $104_P$ has a dimension D2 covered by the metal gate electrode 146P (at the channel region CH) as measured along the Y direction (the gate-extending direction), in accordance with some embodiments. In some embodiments, the dimension D2 is in a range from about 5 nm to about 8 nm. The P-fin structure $104_P$ has a dimension D3 covered by the gate spacer layer 118 as measured along the Y direction (the gate-extending direction), in accordance with some embodiments. In some embodiments, the dimension D3 is in a range from about 6 nm to about 10 nm. In some embodiments the dimensions, the dimensions D2 and D3 are dimensions of the upper portions $104U_P$ of the P-fin structure $104_P$ measured at the upper surface of the isolation structure. In some embodiments, the dimension D3 is greater than the dimension D2 by about 0.5 nm to about 4 nm. In some embodiments, a ratio of the dimension D2 to the dimension D3 is in a range from about 0.05 to about 0.5.

The N-fin structure $104_N$ has a dimension D4 covered by the metal gate electrode 146N (at the channel region CH) as measured along the Y direction (the gate-extending direction), in accordance with some embodiments. In some embodiments, the dimension D4 is in a range from about 5 nm to about 10 nm. The N-fin structure $104_N$ has a dimension D5 covered by the gate spacer layer 118 as measured along the Y direction (the gate-extending direction), in accordance with some embodiments. In some embodiments, the dimension D5 is in a range from about 5 nm to about 10 nm. In some embodiments, the dimensions D4 and D5 are dimensions of the N-fin structure $104_N$ measured at the upper surface of the isolation structure. In some embodiments, the dimension D4 is substantially equal to the dimension D5. In some embodiments, the dimension D4 is greater than the dimension D2. In some embodiments, the dimension D3 is substantially equal to the dimension D5.

Figure 3A:
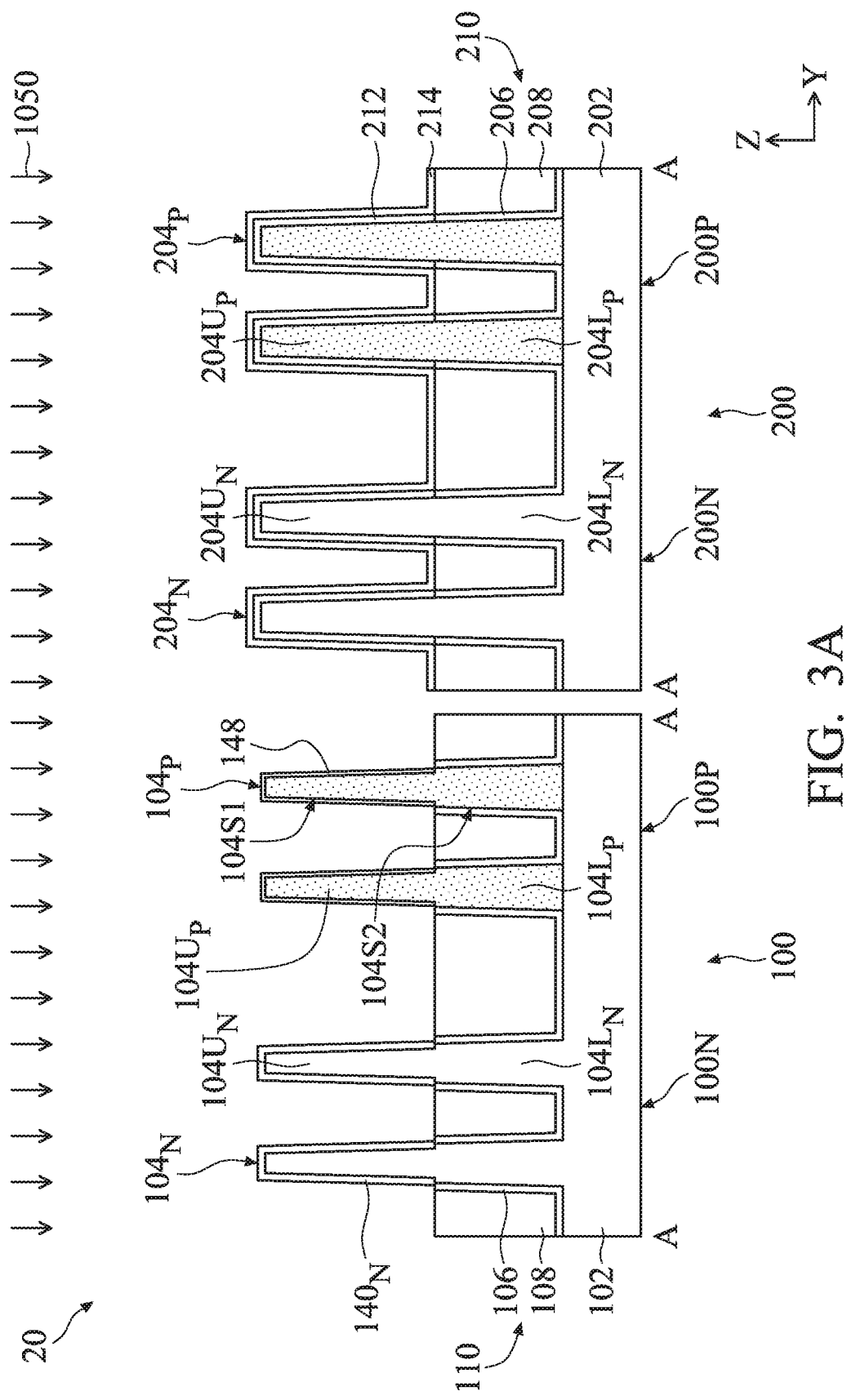
FIGS. 3A and 3B are cross-sectional views illustrating the formation of a semiconductor device at various intermediate stages, in accordance with some embodiments of the disclosure.
Figure 3B:
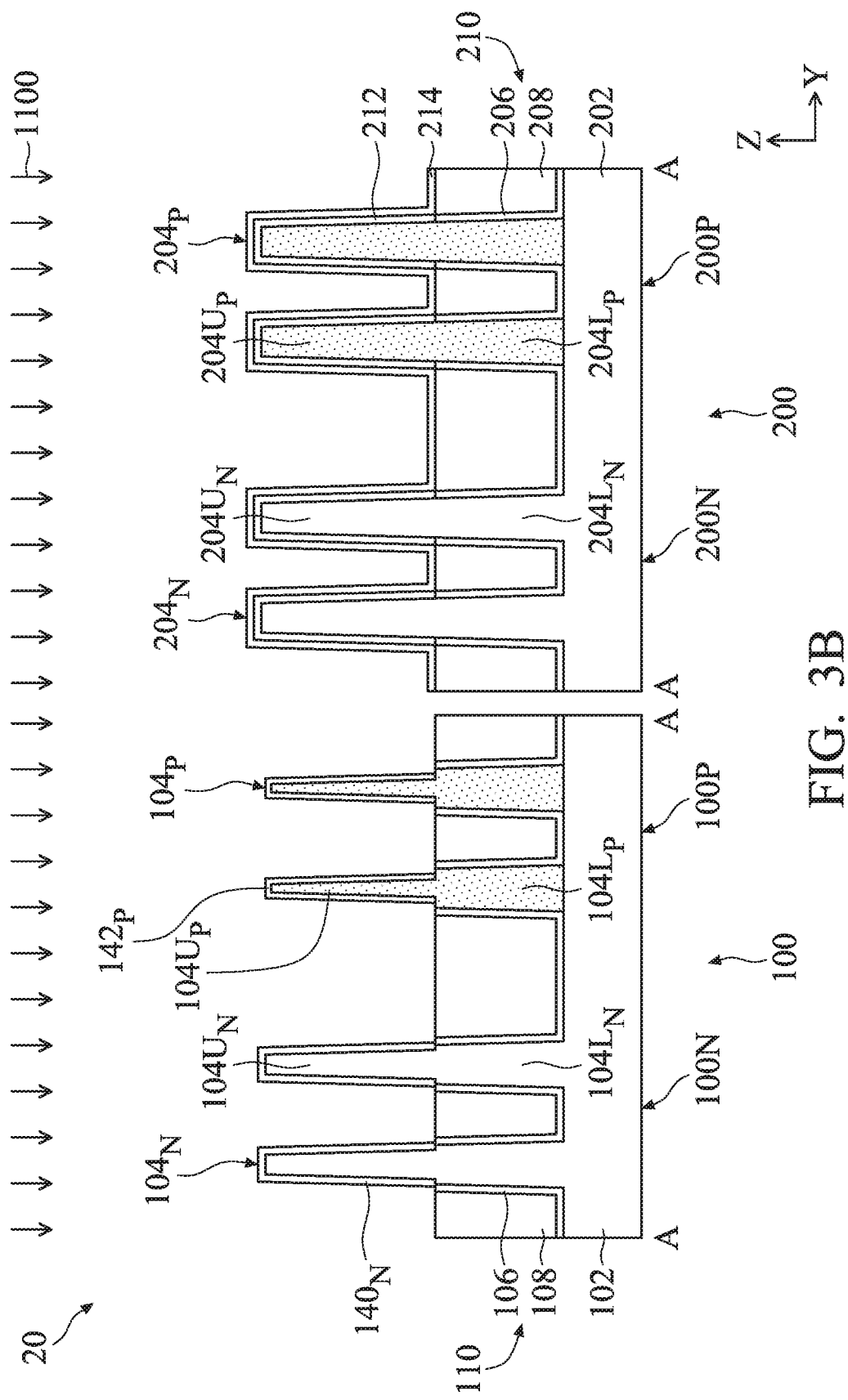

FIGS. 3A and 3B are cross-sectional views illustrating the formation of a semiconductor device at various intermediate stages, in accordance with some embodiments of the disclosure.

After the trimming process discussed above with respect to FIGS. 2L and 2M, a capping layer 148 is formed along the sidewalls and the upper surfaces of the upper portions $104U_P$ of the P-fin structures $104_P$, as shown in FIG. 3A, in accordance with some embodiments. In some embodiments, the capping layer 148 is made of silicon. The capping layer 148 may be configured to improve the quality of the exposed surface of the P-fin structures $104_P$, thereby improving the mobility of the carrier of the resulting semiconductor device. In some embodiments, the capping layer 148 is grown at the semiconductor surface using an epitaxial growth technique. After the capping layer 148 is formed, the interfacial layer 142P is formed using the oxidation process 1100 described previously in FIG. 2N-1, in accordance with some embodiments. In some instances, the capping layer 148 and outer portions of the P-fin structures $104_P$ may be consumed and form the interfacial layer 142P.

Figure 4A:
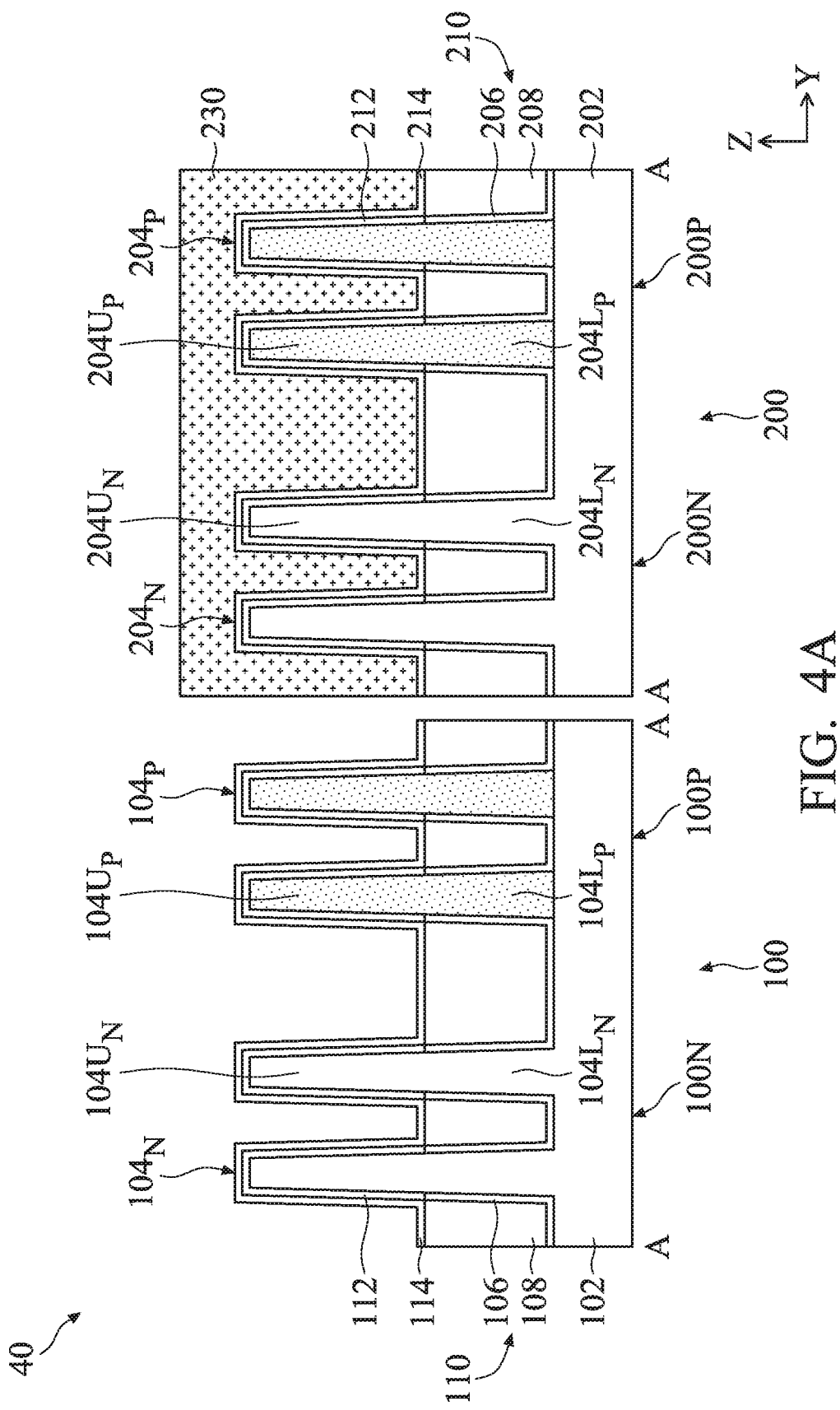
Figure 4B:
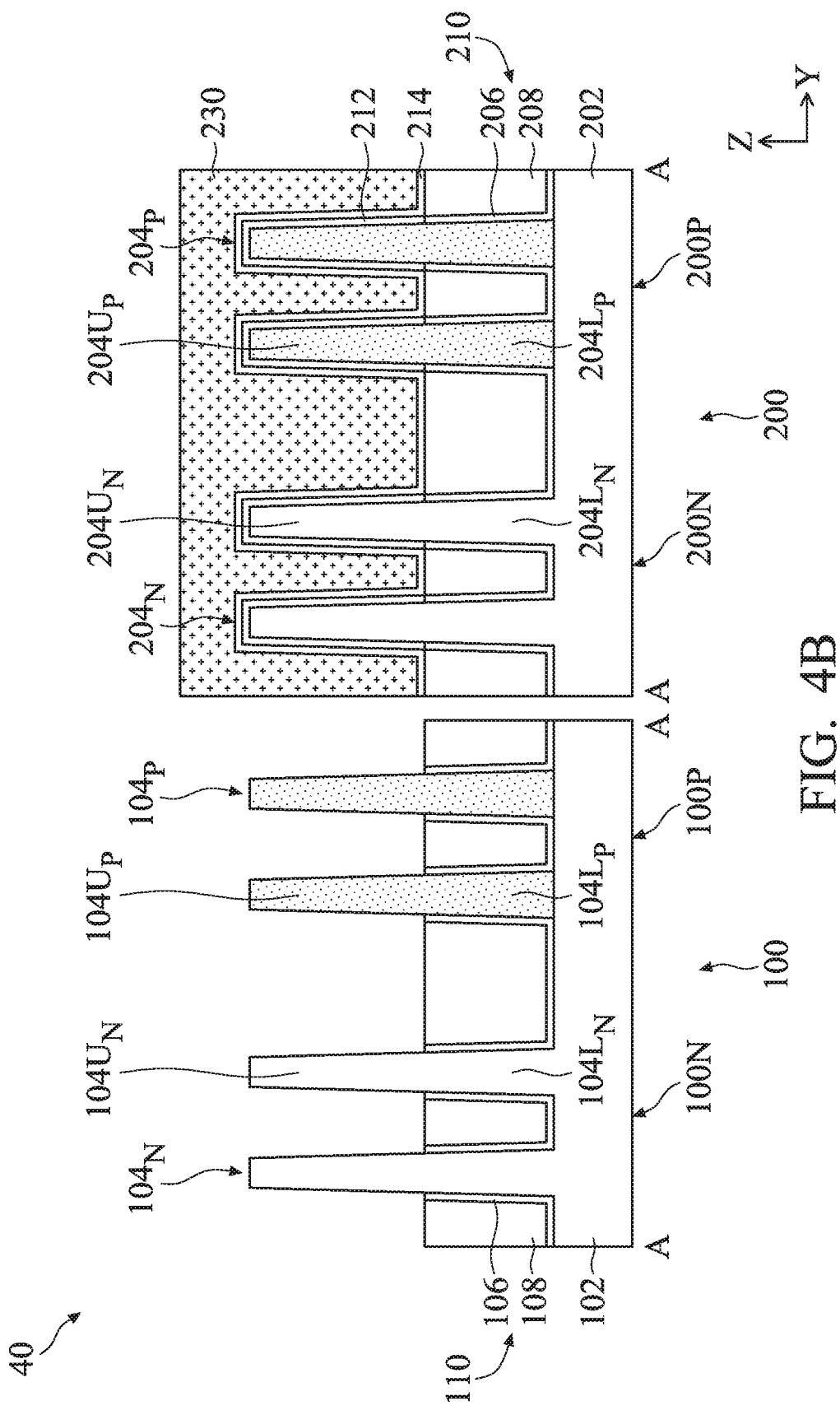
Figure 4C:
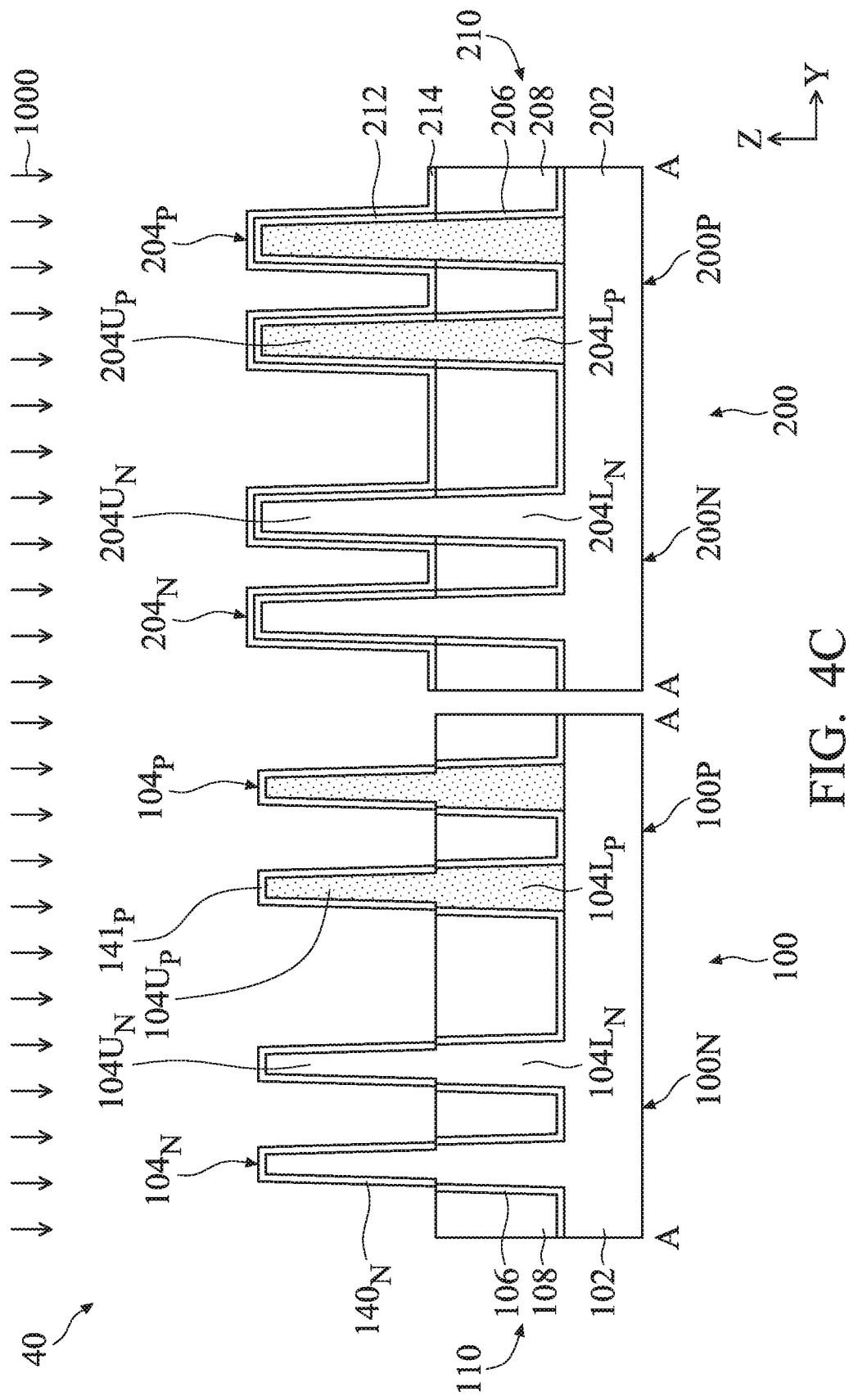
Figure 4D:
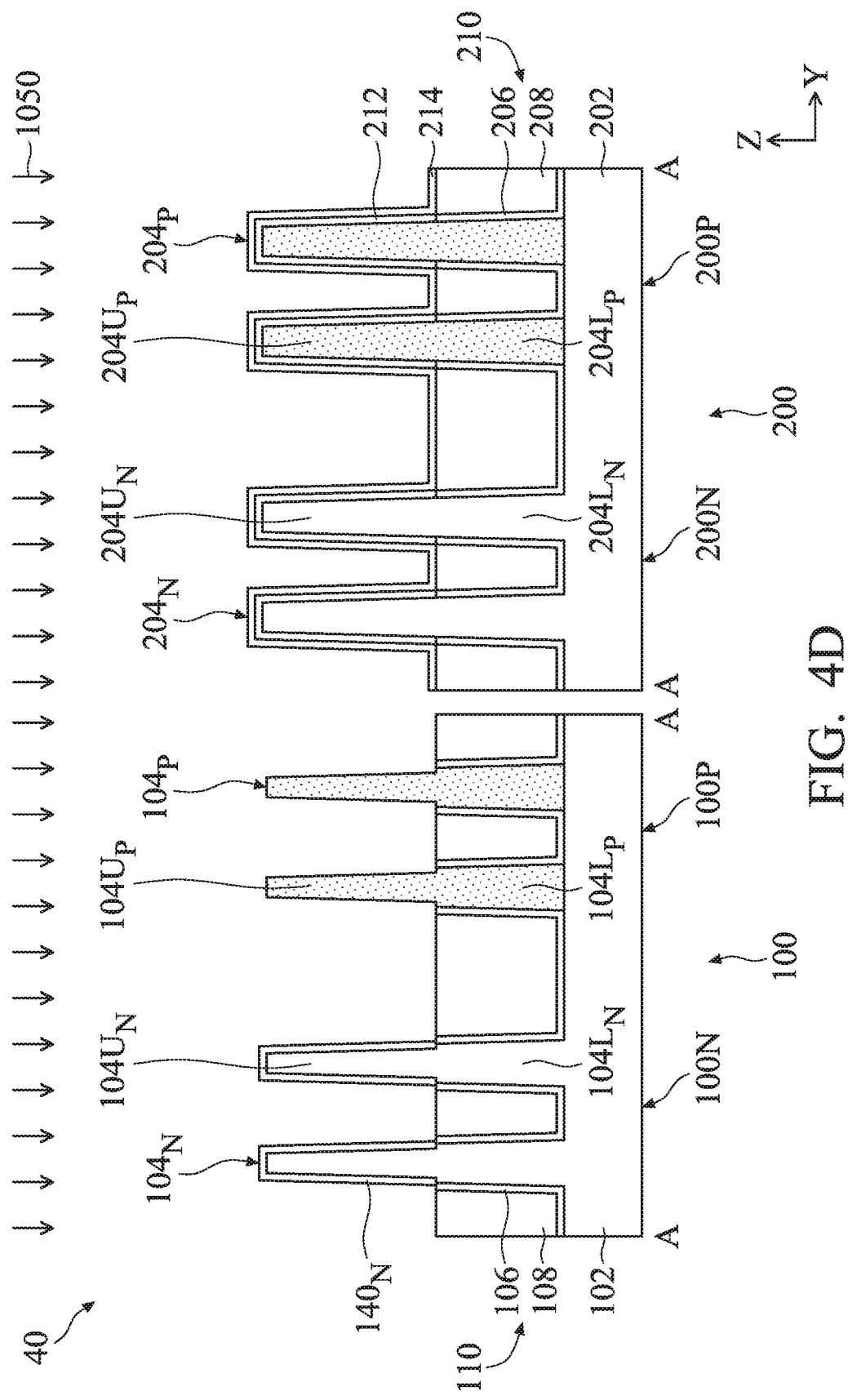
Figure 4E:
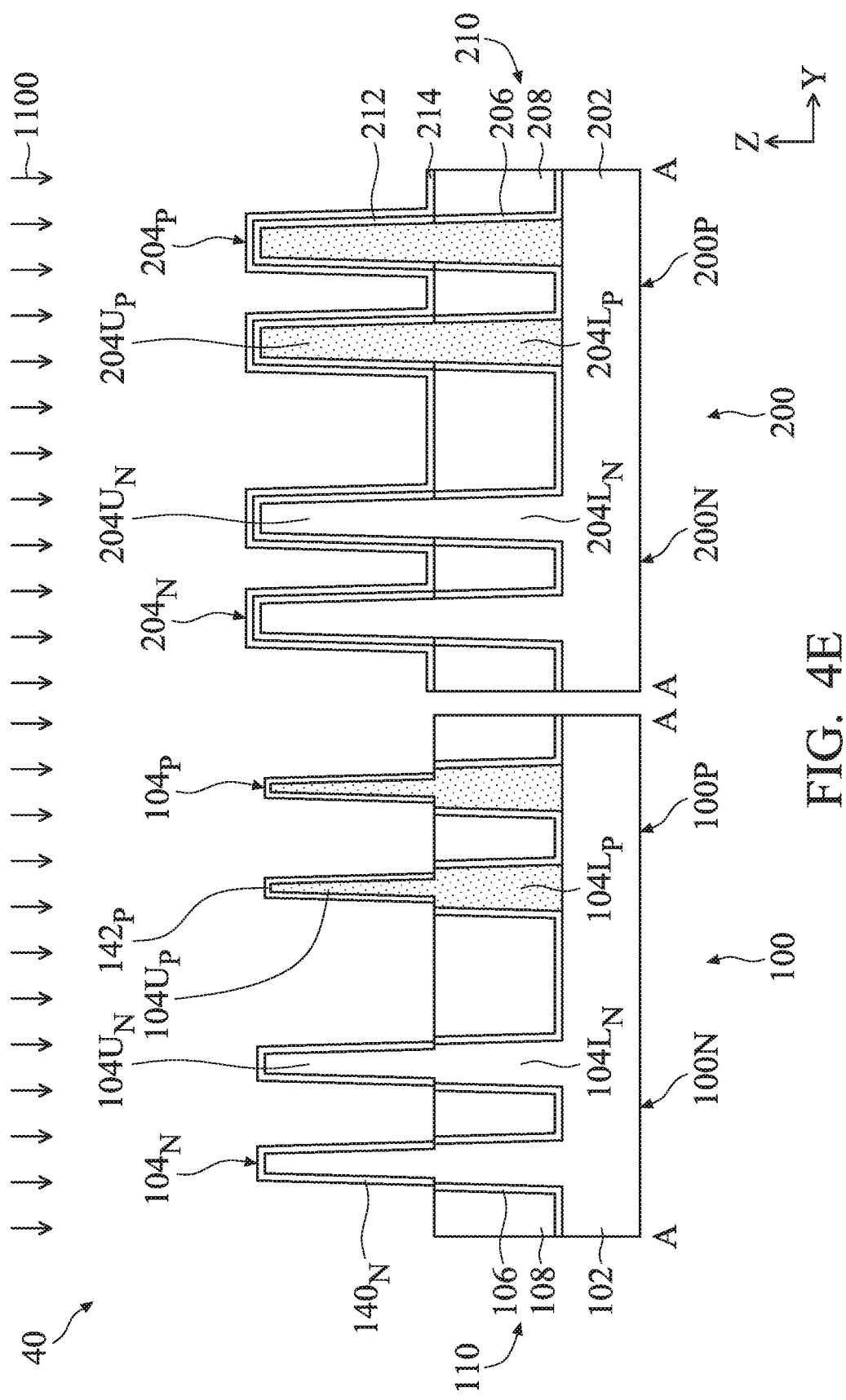
Figure 4F:
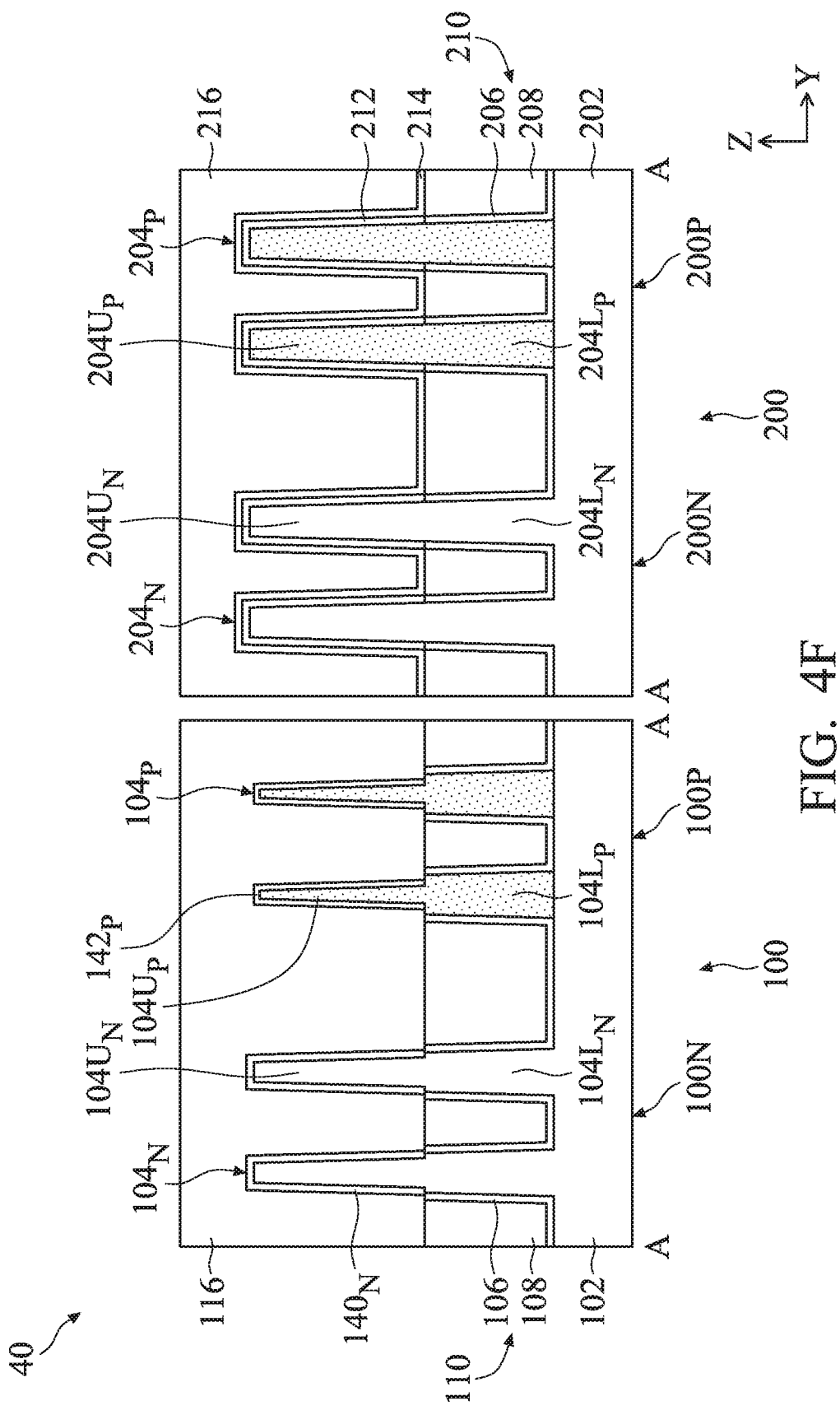
Figures 1, 4G:
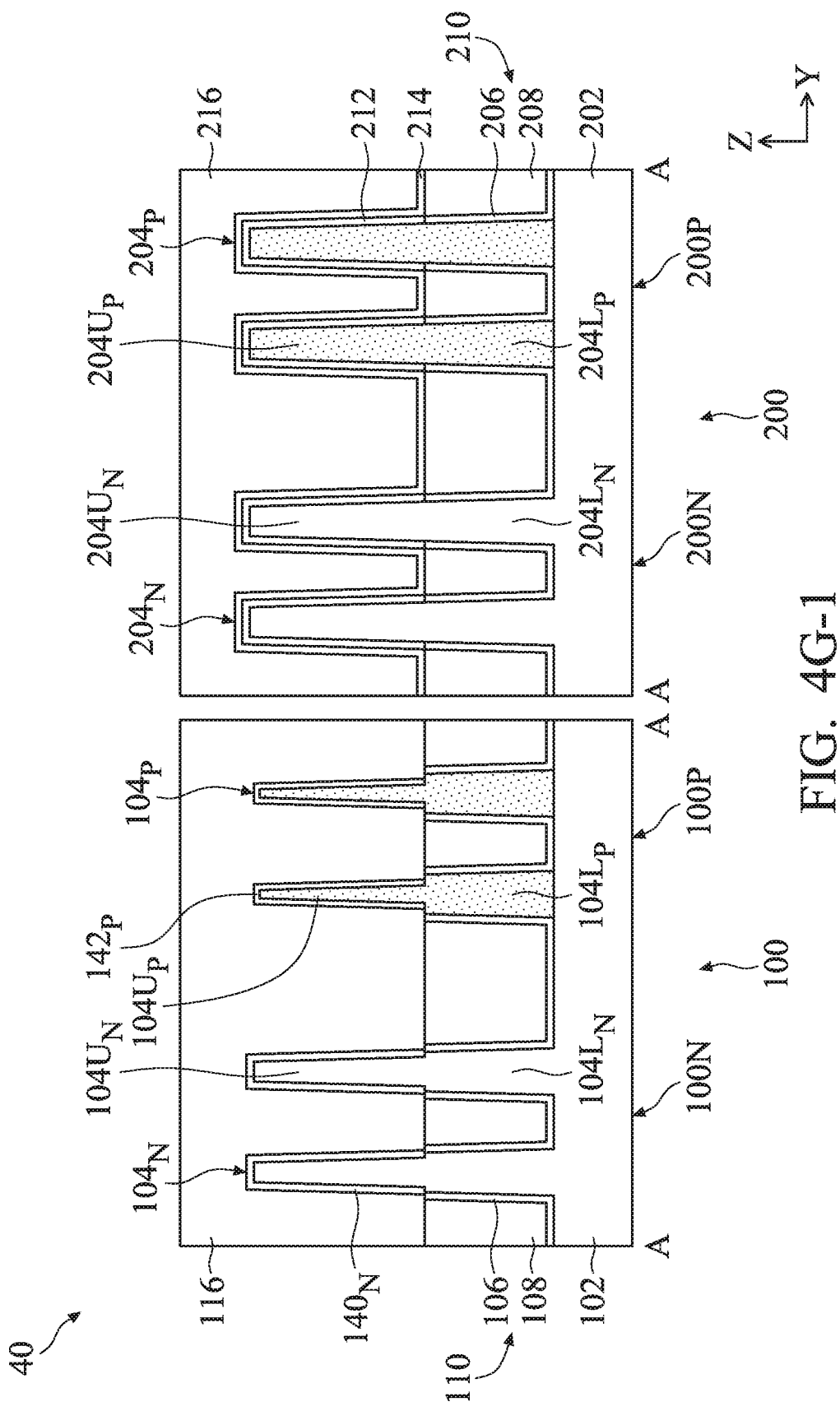
Figures 2, 4G:
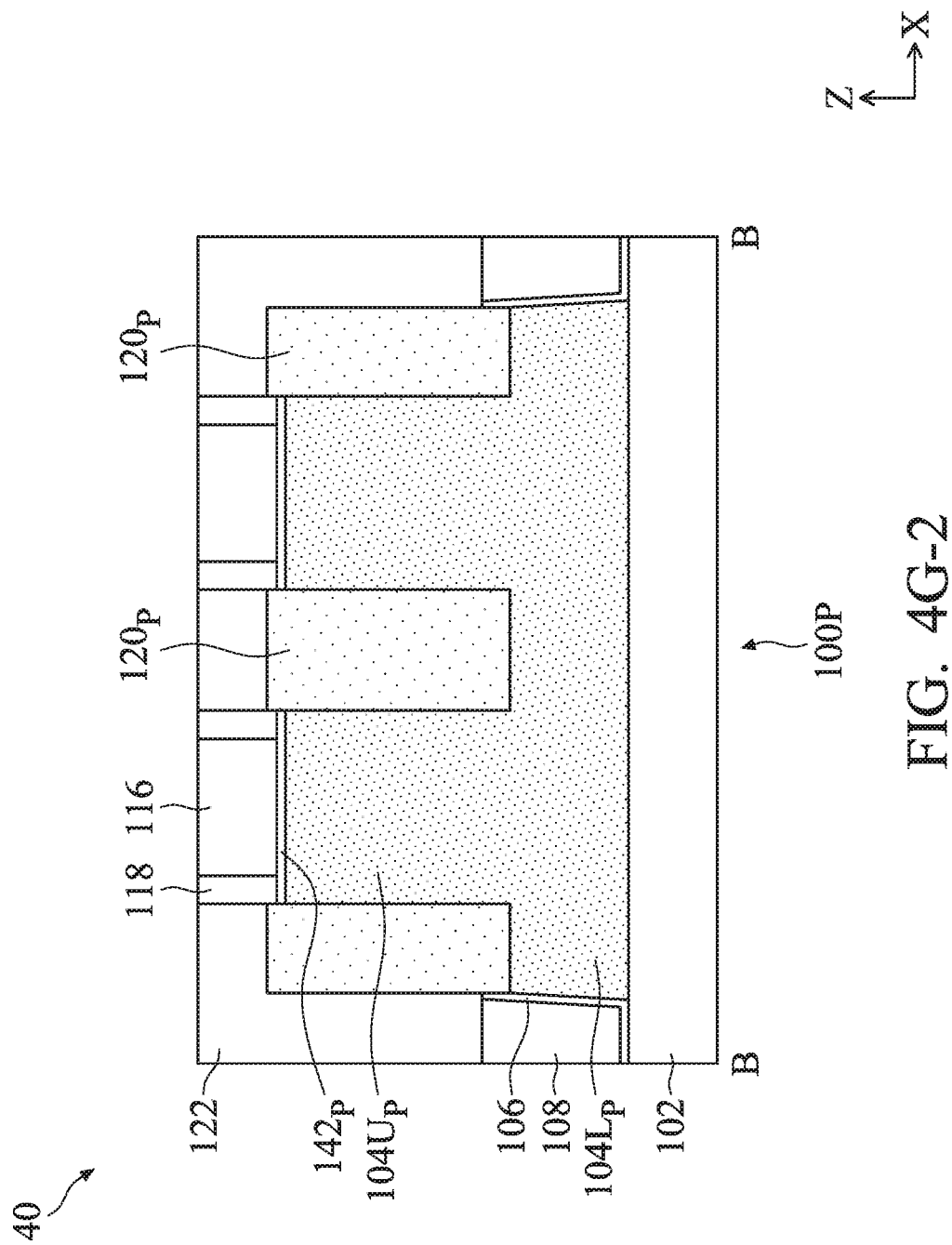
Figures 3, 4G:
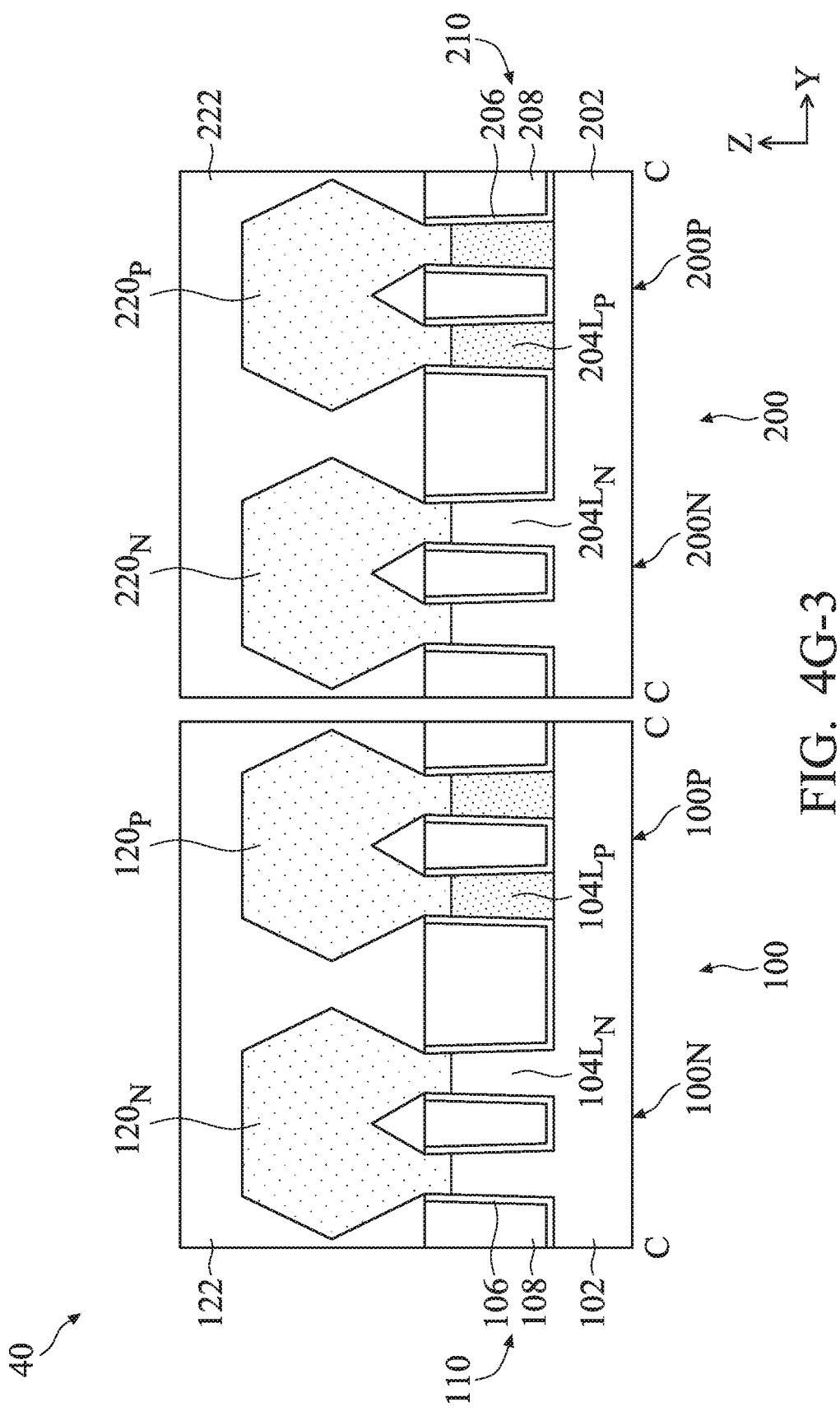
Figure 4H:
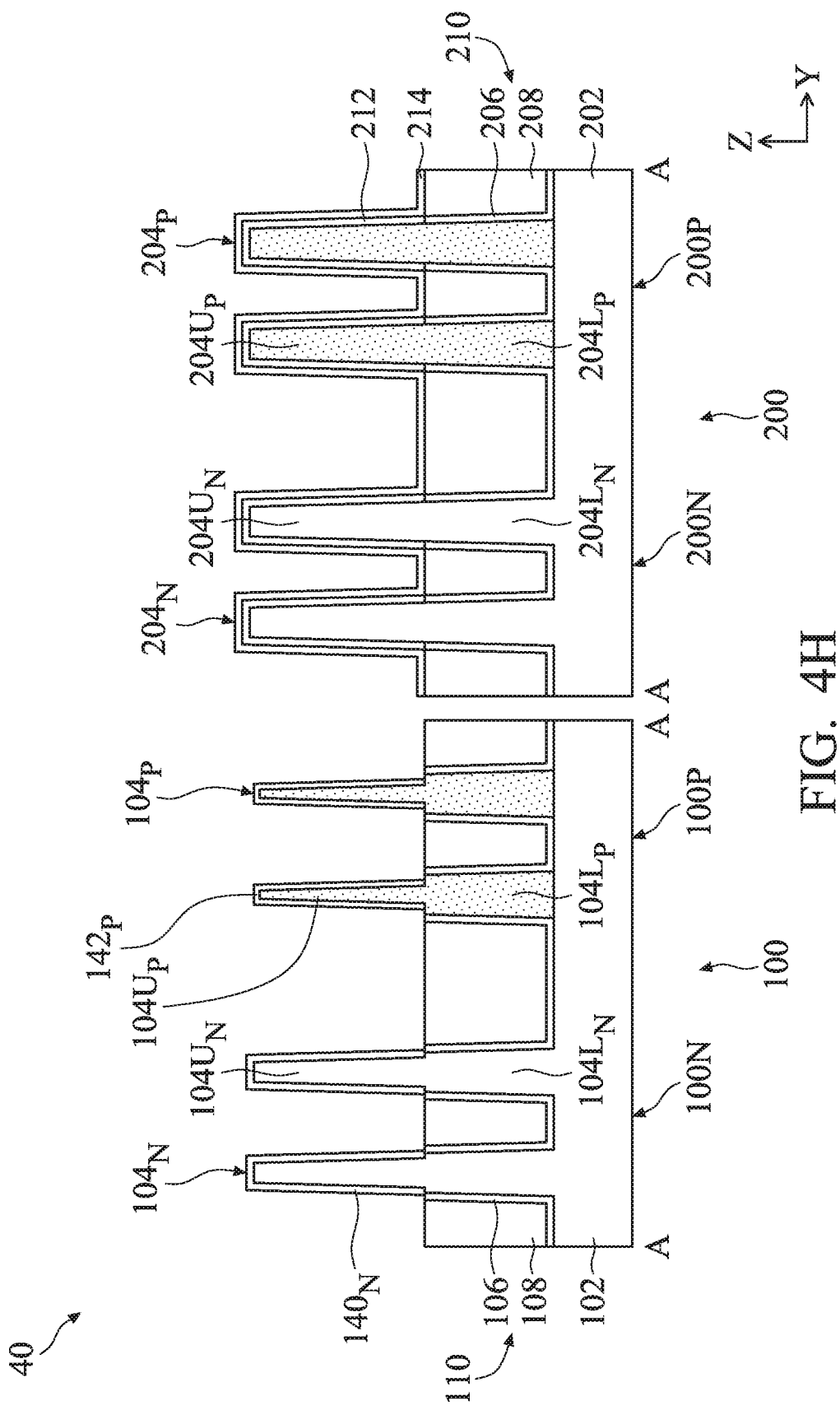
Figures 1, 4I:
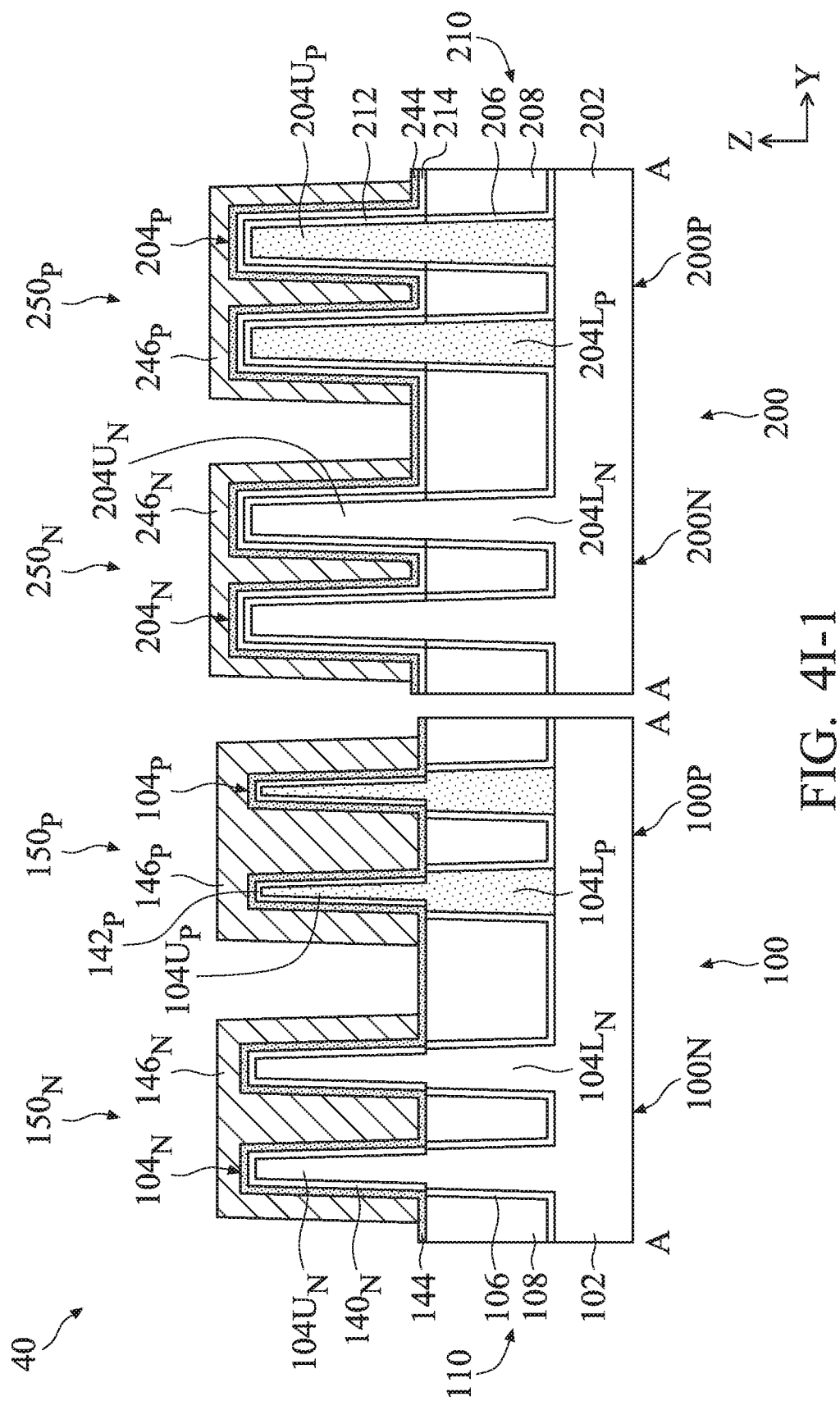
Figures 2, 4I:
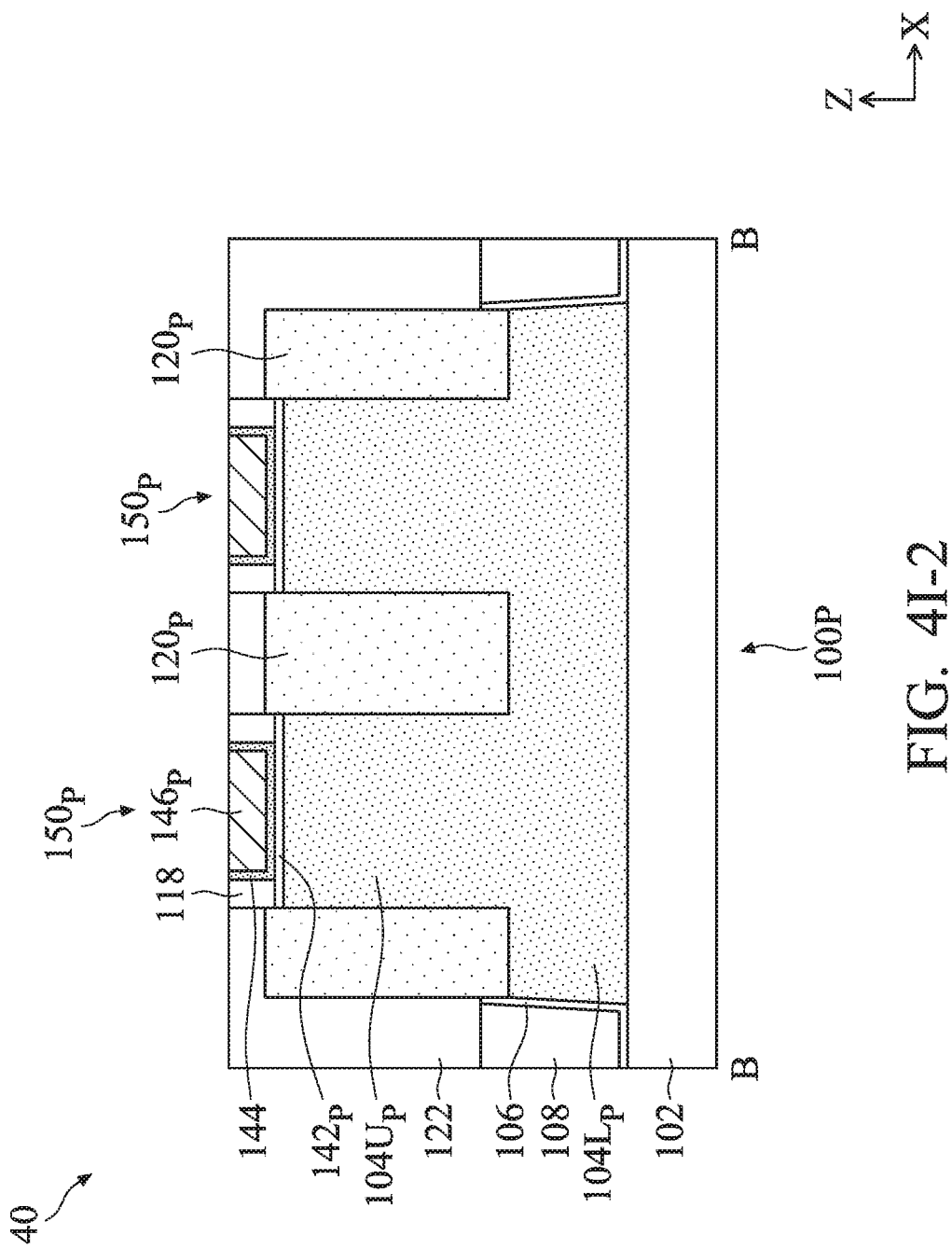

FIGS. 4A-4F, 4G-1, 4G-2, 4G-3, 4H, 4I-1 and 4I-2 are cross-sectional views illustrating the formation of a semiconductor device at various intermediate stages, in accordance with some embodiments of the disclosure. FIGS. 4A-4F, 4G-1, 4H, and 4I-1 are illustrated corresponding to the cross-section A-A of FIG. 1; FIGS. 4G-2 and 4I-2 are illustrated corresponding to the cross-section B-B of FIG. 1; and FIG. 4G-3 is illustrated corresponding to the cross-section C-C of FIG. 1. In the embodiments of FIGS. 4A through 4I-2, the P-fin structure is trimmed at both the source/drain region and the channel region.

FIG. 4A is a cross-sectional view illustrating a semiconductor structure after the formation of a mask element, in accordance with some embodiments.

Continuing from FIG. 2D, a mask element 230 is formed over the semiconductor structure 40 after the capping layers 112 and 212 and the input/out gate dielectric layers 114 and 214 are formed, as shown in FIG. 4A, in accordance with some embodiments. The mask element 230 is formed over the input/output region 200 of the semiconductor structure 40 while the core region 100 of the semiconductor structure 40 is exposed, in accordance with some embodiments.

FIG. 4B is a cross-sectional view illustrating a semiconductor structure after an etching process, in accordance with some embodiments.

One or more etching processes are performed on the semiconductor structure 40 to remove the input/output gate dielectric layer 114 and the capping layer 112, as shown in FIG. 4B, in accordance with some embodiments. The one or more etching processes are performed until the semiconductor surface of the upper portions $104U_N$ of the N-fin structures $104_N$ and the semiconductor surface of the upper portions $104U_P$ of the P-fin structures $104_P$ are exposed, in accordance with some embodiments.

Afterward, the mask element 230 is removed thereby exposing the input/output gate dielectric layer 214, in accordance with some embodiments.

FIGS. 4C and 4D are a cross-sectional view illustrating a trimming process performed on a semiconductor structure, in accordance with some embodiments.

The semiconductor structure 40 is subjected to a selective trimming process in which the P-fin structures $104_P$ are trimmed while the N-fin structures $104_N$, the N-fin structures $204_N$ and the P-fin structures $204_P$ remain untrimmed, in accordance with some embodiments.

The selective trimming process includes performing an oxidation process 1000 on the semiconductor structure 40, as shown in FIG. 4C, in accordance with some embodiments. The oxidation process 1000 may be the same as or similar to that described above with respect to FIG. 2K. The exposed semiconductor surface of the N-fin structures $104_N$ is oxidized in the oxidation process 1000, such that silicon oxide layers $140_N$ are formed on the sidewalls and the upper surfaces of the upper portions $104U_N$ of the N-fin structures $104_N$ at both source/drain region and the channel region, in accordance with some embodiments.

The exposed semiconductor surface of the P-fin structures $104_P$ is oxidized in the oxidation process 1000, such that germanium oxide layers $141_P$ are formed on the sidewalls and the upper surfaces of the upper portions $104U_P$ of the P-fin structures $104_P$ at both source/drain region and the channel region, in accordance with some embodiments.

The selective trimming process further includes performing an etching process 1050 on the semiconductor structure 40, as shown in FIG. 4D, in accordance with some embodiments. The etching process 1050 may be the same as or similar to that described above with respect to FIG. 2L. The etching process 1050 selectively removes the germanium oxide layers $141_P$ formed on the P-fin structures $104_P$ until the semiconductor surface of the upper portions $104U_P$ of the P-fin structure $104_P$ is exposed, in accordance with some embodiments. As such, after the etching process 1050, both the source/drain region and the channel portion of the P-fin structures $104_P$ has been trimmed, in accordance with some embodiments.

FIG. 4F is a cross-sectional view illustrating a semiconductor structure after an oxidation process, in accordance with some embodiments.

An oxidation process 1100 is performed on the semiconductor structure 40, in accordance with some embodiments. The etching process 1100 may be the same as or similar to that described above with respect to FIG. 2M. The exposed semiconductor surface of the P-fin structures $104_P$ is oxidized in the oxidation process 1100, such that interfacial layers $142_P$ are formed on the sidewalls and the upper surfaces of the upper portion $104U_P$ of the P-fin structures $104_P$, in accordance with some embodiments. The oxidation process 1100 may further enhance the quality of the silicon oxide layer $140_N$. The silicon oxide layer $140_N$ may be also referred to as the interfacial layer $140_N$, in accordance with some embodiments.

FIG. 4F is a cross-sectional view illustrating a semiconductor structure after the formation of a dummy gate electrode layer, in accordance with some embodiments.

Dummy gate electrode layers 116 and 216 are formed over the semiconductor structure 40, as shown in FIG. 4F, in accordance with some embodiments. In the core region 100, the dummy gate electrode layer 116 extends across the N-fin structures $104_N$ and the P-fin structures $104_P$ to wrap the channel region of the N-fin structures $104_N$ and the channel region of the P-fin structures $104_P$, in accordance with some embodiments.

In the input/output region 200, the dummy gate electrode layer 216 extends across the N-fin structures $204_N$ and the P-fin structures $204_P$ to wrap the channel region of the N-fin structures $204_N$ and the channel region of the P-fin structures $204_P$, in accordance with some embodiments.

In some embodiments, the dummy gate electrode layer 116 and the silicon oxide layer $140_N$ combine to form a dummy gate structure at the NMOS region 100N of the core region 100; the dummy gate electrode layer 116 and the interfacial layer $142_P$ combine to form a dummy gate structure at the PMOS region 100P of the core region 100; and the dummy gate electrode layer 216 and the input/output gate dielectric layer 214 combine to form a dummy gate structure at the input/output region 200.

FIGS. 4G-1, 4G-2 and 4G-3 are cross-sectional views illustrating a semiconductor structure after the formation of a gate spacer layer, a source/drain feature and an ILD layer, in accordance with some embodiments.

In the core region 100, a gate spacer layer 118 is formed along opposite sidewalls of the dummy gate structure, as shown in FIG. 4G-2, in accordance with some embodiments. It should be noted that in the input/output region 200, the gate spacer layer is also formed along opposite sidewalls of the dummy gate structure, although this is not shown in FIGS. 4G-1, 4G-2 and 4G-3.

Source/drain features $120_N$, $120_P$, $220_N$ and $220_P$ are formed on the semiconductor structure 40, as shown in FIGS. 4G-2 and 4G-3, in accordance with some embodiments. In the core region 100, the source/drain features $120_N$ are formed on the lower portions $104L_N$ of the N-fin structures $104_N$ at the source/drain region, in accordance with some embodiments. The source/drain features $120_P$ are formed on the lower portions $104L_P$ of the P-fin structures $104_P$ at the source/drain region, in accordance with some embodiments.

In the input/output region 200, the source/drain features $220_N$ are formed on the lower portions $204L_N$ of the N-fin structures $204_N$ at the source/drain region, in accordance with some embodiments. The source/drain features $220_P$ are formed on the lower portions $204L_P$ of the P-fin structures $204_P$ at the source/drain region, in accordance with some embodiments.

Afterward, ILD layers 122 and 222 are formed over the semiconductor structure 40, as shown in FIGS. 4F-2 and 4F-3, in accordance with some embodiments.

FIG. 4H is a cross-sectional view illustrating a semiconductor structure after a removal of a dummy gate electrode layer, in accordance with some embodiments.

The dummy gate electrode layers 116 and 216 are removed, as shown in FIG. 4H, in accordance with some embodiments. In the core region 100, the dummy gate electrode layer 116 is removed to form gate trenches that expose the interfacial layers $140_N$ and the interfacial layers $142_P$, in accordance with some embodiments. In some embodiments, the gate spacer layers 118 are also exposed.

In the input/output region 200, the dummy gate electrode layer 216 is removed to form gate trenches that expose the input/output gate dielectric layer 214, in accordance with some embodiments. In some embodiments, the gate spacer layers formed in the input/output region 200 are also exposed.

FIGS. 4I-1 and 4I-2 are cross-sectional views illustrating a semiconductor structure after the formation of metal gate stacks, in accordance with some embodiments.

Core gate dielectric layers 144 and 244 are formed over the semiconductor structure 40, as shown in FIGS. 4I-1 and 4I-2, in accordance with some embodiments. In the core region 100, the core gate dielectric layer 144 is conformally formed along the interfacial layers $140_N$ and the interfacial layers $142_P$, in accordance with some embodiments. The core gate dielectric layer 144 is further conformally formed along the upper surface of the isolation structure 110 and the sidewalls of the gate spacer layer 118, in accordance with some embodiments.

In the input/output region 200, the core gate dielectric layer 244 is conformally formed along the input/output gate dielectric layer 214, in accordance with some embodiments. The core gate dielectric layer 244 is further conformally formed along the upper surface of the isolation structure 210, in accordance with some embodiments. It should be noted that the core gate dielectric layer 244 is further formed along the sidewalls of the gate spacer layer in the input/output region 200, although this is not shown in FIGS. 4I-1 and 4I-2.

Metal gate electrode layers $146_N$, $146_P$, $246_N$ and $246_P$ are formed over the semiconductor structure 40, as shown in FIGS. 4I-1 and 4I-2, in accordance with some embodiments.

In the NMOS region 100N of the core region 100, the metal gate electrode layer $146_N$ is formed over the core gate dielectric layer 144 and across the N-fin structures $104_N$ to wrap the channel regions of the N-fin structures $104_N$, in accordance with some embodiments. After the metal gate electrode layer $146_N$ is formed, N-type core semiconductor devices $150_N$ (such as N-FINFET) have been formed, in accordance with some embodiments.

In the PMOS region 100P of the core region 100, the metal gate electrode layer $146_P$ is formed over the core gate dielectric layer 144 and across the P-fin structures $104_P$ to wrap the channel regions of the fin structures $104_P$, in accordance with some embodiments. After the metal gate electrode layer $146_P$ is formed, P-type core semiconductor devices $150_P$ (such as P-FINFET) have been formed, in accordance with some embodiments.

In the NMOS region 200N of the input/output region 200, the metal gate electrode layer $246_N$ is formed over the core gate dielectric layer 244 and across the N-fin structures $204_N$ to wrap the channel regions of the fin structures $204_N$, in accordance with some embodiments. After the metal gate electrode layer $246_N$ is formed, N-type input/output semiconductor devices $250_N$ (such as N-FINFET) have been formed, in accordance with some embodiments.

In the PMOS region 200P of the input/output region 200, the metal gate electrode layer $246_P$ is formed over the core gate dielectric layer 244 and across the fin structures $204_P$ to wrap the channel regions of the P-fin structures $204_P$, in accordance with some embodiments. After the metal gate electrode layer $246_P$ is formed, P-type input/output semiconductor devices $250_P$ (such as P-FINFET) have been formed, in accordance with some embodiments.

Figure 4J:
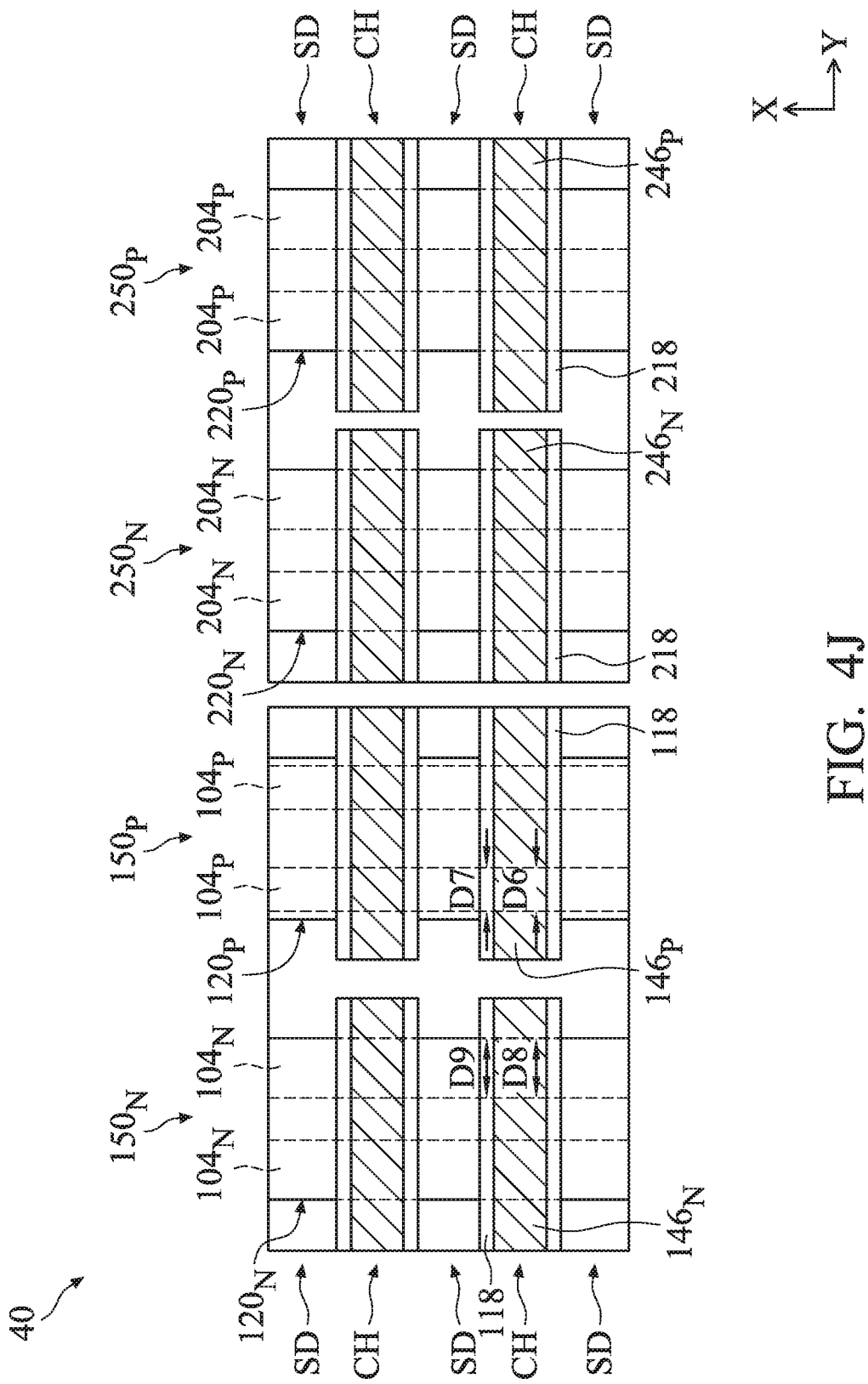
FIG. 4J is a top view of the semiconductor structure of FIGS. 4I-1 and 4I-2, in accordance with some embodiments of the disclosure.

FIG. 4J is a top view of the semiconductor structure 40 of FIGS. 4I-1 and 4I-2, in accordance with some embodiments of the disclosure. For the sake of simplicity and clarity, FIG. 4J only shows fin structures, gate spacer layers, source/drain features, and metal gate electrode.

The P-fin structure $104_P$ has a dimension D6 covered by the metal gate electrode 146P (at the channel region CH) as measured along the Y direction (the gate-extending direction), in accordance with some embodiments. The P-fin structure $104_P$ has a dimension D7 covered by the gate spacer layer 118 as measured along the Y direction (the gate-extending direction), in accordance with some embodiments. In some embodiments, the dimensions D6 and D7 are dimensions of the upper portions $104U_P$ of the P-fin structure $104_P$ measured at the upper surface of the isolation structure. In some embodiments, the dimension D6 is substantially equal to the dimension D7.

The N-fin structure $104_N$ has a dimension D8 covered by the metal gate electrode 146N (at the channel region CH) as measured along the Y direction (the gate-extending direction), in accordance with some embodiments. The N-fin structure $104_N$ has a dimension D9 covered by the gate spacer layer 118 as measured along the Y direction (the gate-extending direction), in accordance with some embodiments. In some embodiments, the dimensions D8 and D9 are dimensions of the upper portions $104U_N$ of the N-fin structure $104_N$ measured at the upper surface of the isolation structure. In some embodiments, the dimension D8 is substantially equal to the dimension D9. In some embodiments, the dimension D8 is greater than the dimension D6 by about 0.5 nm to about 4 nm. In some embodiments, the dimension D9 is greater than the dimension D7 by about 0.5 nm to about 4 nm.

Figure 5:
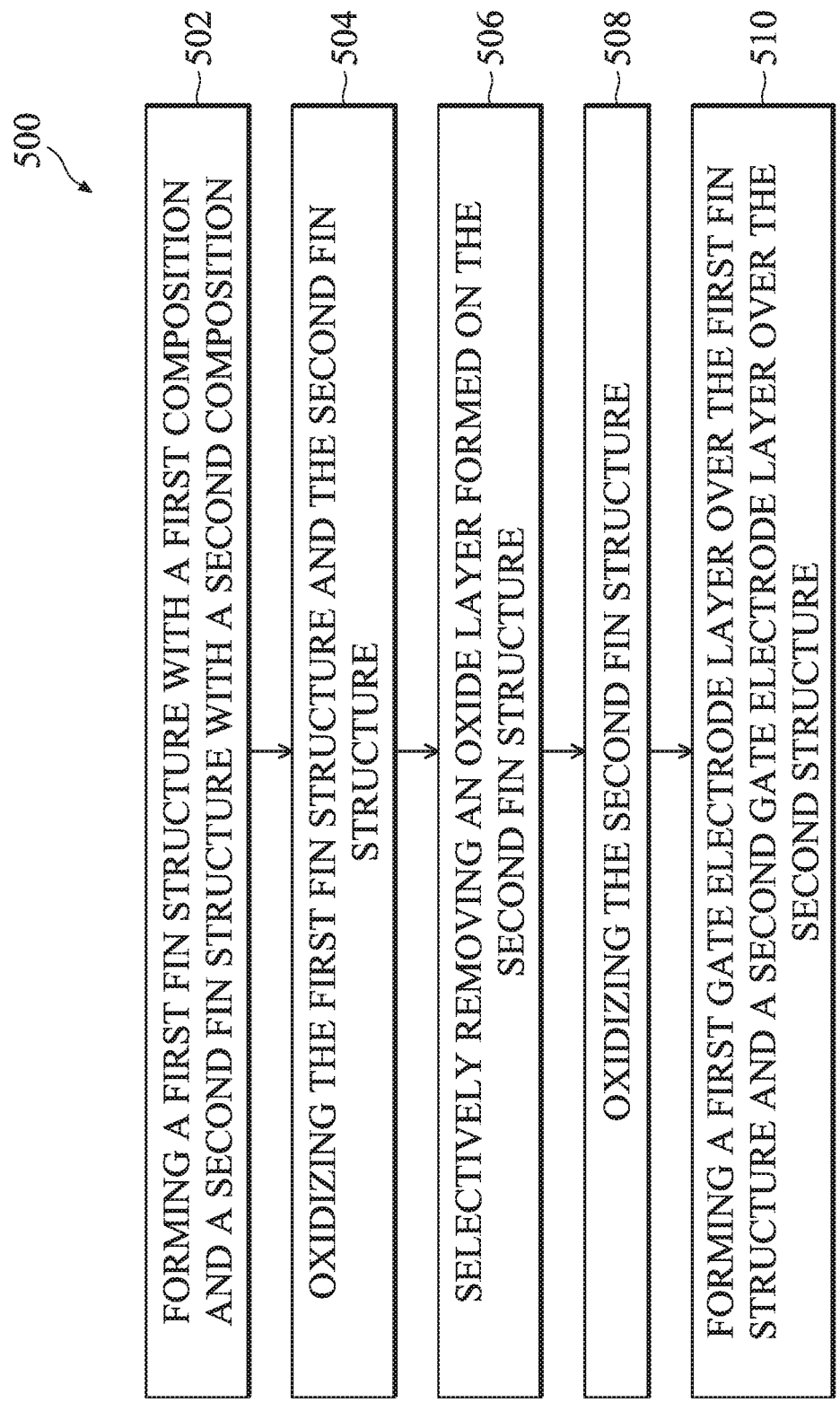
FIG. 5 is a flow chart that outlines a method for forming a semiconductor structure, in accordance with some embodiments of the disclosure.

FIG. 5 is a flow chart that outlines a method 500, in accordance with some embodiments of the disclosure. The method 500 is used to fabricate the semiconductor structure 20 or 40, in accordance with some embodiments.

In operation 502, a first fin structure with a first concentration and a second fin structure with a second concentration are formed. In some embodiments, the N-fin structure $104_N$ and the P-fin structure $104_P$ are formed, where the N-fin structure 104N is made of Si or SiGe with lower Ge percentage while the P-fin structure $104_P$ is made of SiGe with higher Ge percentage, as shown in FIG. 2B.

In operation 504, the first fin structure and the second fin structure are oxidized. In some embodiments, the N-fin structure $104_N$ and the P-fin structure $104_P$ are oxidized in the oxidation process 1000, as shown in FIG. 2K and FIG. 4C.

In operation 506, an oxide layer formed on the second fin structure is selectively removed. In some embodiments, a germanium oxide layer $141_P$ formed on the P-fin structure $104_P$ is removed in the etching process 1050, as shown in FIG. 2L and FIG. 4D.

In operation 508, the second fin structure is oxidized. In some embodiments, the P-fin structure $104_P$ are oxidized in the oxidation process 1100, as shown in FIG. 2M and FIG. 4E.

In operation 510, a first gate electrode layer is formed over the first fin structure and a second gate electrode layer is formed over the second fin structure. In some embodiments, the metal gate electrode layer $146_N$ is formed over the N-fin structure $104_N$ and the metal gate electrode layer $146_P$ is formed over the P-fin structure $104_P$, as shown in FIGS. 2N-1 and 2N-2 and FIGS. 4I-1 and 4I-2.

As described above, the method for forming a semiconductor structure includes a selective trimming process for a P-fin structure. The selective trimming process includes forming an N-fin structure $104_N$ and a P-fin structure $104_P$, oxidizing the N-fin structure $104_N$ and the P-fin structure $104_P$, and removing an oxide layer $141_P$ formed on the P-fin structure $104_P$ while the oxide layer $140_N$ formed on the N-fin structure $104_N$ remains unremoved. As a result, selectively trimming the P-fin structure may allow for independent adjustment of the performance (e.g., threshold voltage) of the N-type semiconductor devices and the P-type semiconductor devices. Furthermore, the fin structure may be fabricated initially with a larger dimension (e.g., fin width) or a lower aspect ratio, and thus fin bending and collapse may be less of a concern.

Embodiments of a method for forming a semiconductor structure are provided. The method for forming the semiconductor structure may include oxidizing the first fin structure to form a first oxide layer and the second fin structure to form a second oxide layer, and removing the second oxide layer formed on the second fin structure. As a result, the second fin structure may be selectively trimmed, which may allow for independent adjustment of the performance of the different type of semiconductor devices.

In some embodiments, a method for forming a semiconductor structure is provided. The method for forming the semiconductor structure includes forming a first fin structure with a first composition and a second fin structure with a second composition over a substrate, oxidizing the first fin structure to form a first oxide layer and oxidizing the second fin structure to form a second oxide layer, removing the second oxide layer formed on the second fin structure, oxidizing the second fin structure to form a third oxide layer over the second fin structure, and forming a first metal gate electrode layer over the first oxide layer and a second metal gate electrode layer over the third oxide layer.

In some embodiments, a method for forming a semiconductor structure is provided. The method for forming the semiconductor structure includes forming a first fin structure in a core region of a substrate and a second fin structure in an input/output region of the substrate, forming a silicon oxide layer over the second fin structure, forming a germanium oxide layer over the first fin structure, etching away the germanium oxide layer, forming an interfacial layer over the first fin structure, forming a first metal gate electrode layer over the interfacial layer in the core region, and forming a second metal gate electrode layer over the silicon oxide layer in the input/output region.

In some embodiments, a semiconductor structure is provided. The semiconductor structure includes a first transistor on a substrate. The first transistor includes a first fin structure and a first gate electrode layer extending across a first channel region of the first fin structure. The semiconductor structure also includes a second transistor on the substrate. The second transistor includes a second fin structure and a second gate electrode layer extending across a second channel region of the second fin structure. The first channel region of the first fin structure is narrower than the second channel region of the second fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first fin structure with a first composition and a second fin structure with a second composition over a substrate;
    oxidizing the first fin structure to form a first oxide layer and oxidizing the second fin structure to form a second oxide layer;
    removing the second oxide layer formed on the second fin structure;
    oxidizing the second fin structure to form a third oxide layer over the second fin structure; and
    forming a first metal gate electrode layer over the first oxide layer and a second metal gate electrode layer over the third oxide layer.

2. The method for forming the semiconductor structure as claimed in claim 1, wherein:
    the first fin structure is made of Si and the second fin structure is made of SiGe, or the first fin structure is made of $SiGe_x$ and the second fin structure is made of $SiGe_y$, wherein x<y.

3. The method for forming the semiconductor structure as claimed in claim 1, wherein the first oxide layer is a silicon oxide layer and the second oxide layer is a germanium oxide layer.

4. The method for forming the semiconductor structure as claimed in claim 1, wherein the first oxide layer remains on the first fin structure after the second oxide layer is removed.

5. The method for forming the semiconductor structure as claimed in claim 1, wherein the second oxide layer is removed using an alkaline solution.

6. The method for forming the semiconductor structure as claimed in claim 1, wherein the first fin structure is formed in an NMOS region of the substrate and the second fin structure is formed in a PMOS region of the substrate.

7. The method for forming the semiconductor structure as claimed in claim 1, wherein the first fin structure and the second fin structure are formed in a core region of the substrate, and the method further comprises, before oxidizing the first fin structure to form the first oxide layer and oxidizing the second fin structure to form the second oxide layer:
    forming a third fin structure in an input/output region of the substrate;
    depositing an input/output gate dielectric layer over the first fin structure, the second fin structure, and the third fin structure; and
    removing a portion of the input/output gate dielectric layer formed over the first fin structure and the second fin structure.

8. The method for forming the semiconductor structure as claimed in claim 7, further comprising, before forming the first metal gate electrode layer over the first oxide layer and the second metal gate electrode layer over the third oxide layer:
    forming a core gate dielectric layer over the first oxide layer and the third oxide layer in the core region and forming the core gate dielectric layer over the input/output gate dielectric layer in the input/output region.

9. The method for forming the semiconductor structure as claimed in claim 1, further comprising, before oxidizing the first fin structure to form the first oxide layer and oxidizing the second fin structure to form the second oxide layer:
    forming a dummy gate electrode layer across the first fin structure and across the second fin structure;
    forming a gate spacer layer along a sidewall of the dummy gate electrode layer; and
    removing the dummy gate electrode layer.

10. The method for forming the semiconductor structure as claimed in claim 1, further comprising, after oxidizing the second fin structure to form the third oxide layer:
    forming a dummy gate electrode layer across the first fin structure and the second fin structure; and
    forming a first source/drain feature over the first fin structure a second source/drain feature over the second fin structure.

11. A method for forming a semiconductor structure, comprising:
    forming a first fin structure in a core region of a substrate and a second fin structure in an input/output region of the substrate;
    forming a silicon oxide layer over the second fin structure;
    forming a germanium oxide layer over the first fin structure;
    etching away the germanium oxide layer;
    forming an interfacial layer over the first fin structure;
    forming a first metal gate electrode layer over the interfacial layer in the core region; and
    forming a second metal gate electrode layer over the silicon oxide layer in the input/output region.

12. The method for forming the semiconductor structure as claimed in claim 11, wherein etching away the germanium oxide layer comprises:
    immersing the first fin structure and the second fin structure into an alkaline solution, wherein the silicon oxide layer prevents the second fin structure from being etched.

13. The method for forming the semiconductor structure as claimed in claim 11, wherein forming the silicon oxide layer comprises forming the silicon oxide layer over the first fin structure, and the method further comprises:
    forming a mask element covering the input/output region;
    etching away a portion of the silicon oxide layer formed over the first fin structure; and
    removing the mask element.

14. The method for forming the semiconductor structure as claimed in claim 11, further comprising:

forming a capping layer on the first fin structure and the second fin structure, wherein the silicon oxide layer is formed over the capping layer.

15. The method for forming the semiconductor structure as claimed in claim 11, wherein the first fin structure and the second fin structure are made of silicon germanium.

16. The method for forming the semiconductor structure as claimed in claim 11, wherein forming the germanium oxide layer comprises oxidizing the first fin structure.

17. A method for forming a semiconductor structure, comprising:
    forming a fin structure over a substrate;
    forming source/drain features in source/drain regions of the fin structure;
    after forming the source/drain features, oxidizing a channel region of the fin structure to form a first oxide layer on the channel region of the fin structure;
    etching the first oxide layer to expose the channel region of the fin structure;
    oxidizing the channel region of the fin structure to form a second oxide layer on the channel region of the fin structure;
    forming a gate dielectric layer over the second oxide layer; and
    forming a metal gate electrode layer over the gate dielectric layer.

18. The method for forming the semiconductor structure as claimed in claim 17, further comprising:
    forming a lining layer on a lower portion of the fin structure; and
    forming an insulating material over the lining layer to surround the lower portion of the fin structure, wherein the first oxide layer covers the upper surface of the lining layer, and the second oxide layer do not cover the upper surface of the lining layer.

19. The method for forming the semiconductor structure as claimed in claim 17, further comprising:
    recessing the substrate to form a space in the substrate;
    forming silicon germanium in the spacer; and
    patterning the silicon germanium to form the fin structure.

20. The method for forming the semiconductor structure as claimed in claim 17, further comprising, before forming the first oxide layer on the channel region of the fin structure:
    depositing a third oxide layer over the channel region of the fin structure;
    forming a dummy gate electrode layer over the third oxide layer;
    forming a spacer layer over a sidewall of the dummy gate electrode layer;
    removing the dummy gate electrode layer; and
    removing the third oxide layer.

* * * * *